US012274093B2

(12) United States Patent
Park et al.

(10) Patent No.: US 12,274,093 B2
(45) Date of Patent: Apr. 8, 2025

(54) WIRING SUBSTRATE AND DISPLAY DEVICE INCLUDING THE SAME

(71) Applicant: Samsung Display Co., LTD., Yongin-si (KR)

(72) Inventors: Joon Yong Park, Gunpo-si (KR); Gyung Min Baek, Yongin-si (KR); Shin Il Choi, Hwaseong-si (KR); Do Keun Song, Yongin-si (KR); Young Rok Kim, Anyang-si (KR); Jong Hyun Choung, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 394 days.

(21) Appl. No.: 17/672,249

(22) Filed: Feb. 15, 2022

(65) Prior Publication Data

US 2022/0406817 A1    Dec. 22, 2022

(30) Foreign Application Priority Data

Jun. 22, 2021    (KR) .................... 10-2021-0080867

(51) Int. Cl.
  *H01L 27/12*    (2006.01)
  *H01L 23/00*    (2006.01)
  (Continued)

(52) U.S. Cl.
  CPC .......... *H10D 86/60* (2025.01); *H01L 25/167* (2013.01); *H10D 86/021* (2025.01);
  (Continued)

(58) Field of Classification Search
  None
  See application file for complete search history.

(56) References Cited

U.S. PATENT DOCUMENTS 7,336,324 B2    2/2008  Kim et al.
8,884,329 B2 *  11/2014  Okabe .................... H01L 33/40
                                                                 257/79
(Continued)

FOREIGN PATENT DOCUMENTS

JP    2010-50112    3/2010
JP    2010-258347   11/2010
(Continued)

OTHER PUBLICATIONS

Extended European Search Report for European Patent Application No. Patent No. 22180575.7 dated Nov. 15, 2022.
(Continued)

*Primary Examiner* — Nishath Yasmeen
(74) *Attorney, Agent, or Firm* — KILE PARK REED & HOUTTEMAN PLLC

(57) ABSTRACT

A display device includes conductive layers including wires and conductive patterns in a display area and a pad area, a via layer on the conductive layers, a first electrode and a second electrode on the via layer in the display area and spaced apart from each other, a first insulating layer on the first electrode and the second electrode, light emitting elements on the first electrode and the second electrode spaced apart from each other on the first insulating layer, and a first connection electrode on the first electrode and electrically contacting the light emitting elements, and a second connection electrode on the second electrode and electrically contacting the light emitting elements, each of the conductive layers includes a first metal layer and a second metal layer on the first metal layer, and the second metal layer contains copper and has a grain size of about 155 nm or less.

18 Claims, 31 Drawing Sheets

(51) Int. Cl.
*H01L 25/16* (2023.01)
*H10D 86/01* (2025.01)
*H10D 86/40* (2025.01)
*H10D 86/60* (2025.01)

(52) U.S. Cl.
CPC .......... *H10D 86/441* (2025.01); *H01L 24/24* (2013.01); *H01L 24/25* (2013.01); *H01L 2224/24147* (2013.01); *H01L 2224/25175* (2013.01); *H01L 2924/12041* (2013.01)

(56) References Cited

U.S. PATENT DOCUMENTS

| | | | |
|---|---|---|---|
| 9,316,879 | B2 | 4/2016 | Choi |
| 10,297,772 | B2 | 5/2019 | Lee et al. |
| 10,698,523 | B2 | 6/2020 | Jang et al. |
| 10,741,661 | B2 | 8/2020 | Li |
| 11,249,588 | B2 | 2/2022 | Jang et al. |
| 11,355,528 | B2 | 6/2022 | Kim et al. |
| 11,798,954 | B2 | 10/2023 | Chang et al. |
| 12,062,667 | B2 | 8/2024 | Kim et al. |
| 2008/0311361 | A1* | 12/2008 | Lee ................. H10K 77/10 156/247 |
| 2018/0083211 | A1* | 3/2018 | Lee .................. H10K 59/122 |
| 2019/0354211 | A1* | 11/2019 | Li .................. H03K 17/9622 |
| 2020/0236795 | A1 | 7/2020 | Ecton et al. |
| 2021/0159250 | A1* | 5/2021 | Chang ................ H01L 25/0753 |
| 2021/0408178 | A1* | 12/2021 | Zhou ..................... H10K 71/60 |

FOREIGN PATENT DOCUMENTS

| | | |
|---|---|---|
| JP | 5370979 | 12/2013 |
| JP | 6291570 | 3/2018 |
| JP | 2019-204967 | 11/2019 |
| JP | 6706653 | 6/2020 |
| JP | 6768180 | 10/2020 |
| JP | 6789184 | 11/2020 |
| JP | 6802887 | 12/2020 |
| KR | 10-2007-0047490 | 5/2007 |
| KR | 10-0897505 | 5/2009 |
| KR | 10-2013-0126240 | 11/2013 |
| KR | 10-2015-0011204 | 1/2015 |
| KR | 10-2017-0140828 | 12/2017 |
| KR | 10-2017-0142243 | 12/2017 |
| KR | 10-2018-0015688 | 2/2018 |
| KR | 10-2018-0032731 | 4/2018 |
| KR | 10-2025103 | 9/2019 |
| KR | 10-2019-015336 | * 11/2019 |
| KR | 10-2020-0024382 | 3/2020 |
| KR | 10-2020-0025199 | 3/2020 |
| KR | 10-2109166 | 5/2020 |
| KR | 10-2121262 | 6/2020 |
| KR | 10-2020-0093100 | 8/2020 |
| KR | 10-2141082 | 8/2020 |
| KR | 10-2020-0114899 | 10/2020 |
| KR | 10-2164941 | 10/2020 |
| KR | 10-2166898 | 10/2020 |
| KR | 10-2021-0024368 | 3/2021 |
| KR | 10-2021-0065238 | 6/2021 |

OTHER PUBLICATIONS

K. Barmak et al., "Annealing behavior of Cu and dilute Cu-alloy films: Precipitation, grain growth, and resistivity", Journal of Applied Physics, Aug. 1, 2003, pp. 1605-1616, vol. 94, No. 3.

* cited by examiner

WIRING SUBSTRATE AND DISPLAY DEVICE INCLUDING THE SAME

CROSS-REFERENCE TO RELATED APPLICATION(S)

This application claims priority to and benefits of Korean Patent Application No. 10-2021-0080867 under 35 U.S.C. § 119 filed on Jun. 22, 2021 in the Korean Intellectual Property Office, the entire contents of which are incorporated herein by reference.

BACKGROUND

1. Technical Field

The disclosure relates to a wiring substrate and a display device including the same.

2. Description of the Related Art

The importance of display devices has steadily increased with the development of multimedia technology. In response thereto, various types of display devices such as an organic light emitting display (OLED), a liquid crystal display (LCD) and the like have been used.

A display device is a device for displaying an image, and may include a display panel, such as an organic light emitting display panel or a liquid crystal display panel. The display panel may include a light emitting element, and the light emitting element may be a light emitting diode (LED). The light emitting diode may include an organic light emitting diode (OLED) that uses an organic material as a light emitting material, and an inorganic light emitting diode that uses an inorganic material as a light emitting material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a wiring substrate in which a wire has a smooth surface and improved straightness, and a display device including the same.

In a wiring substrate according to one embodiment, wires and a conductive pattern of conductive layers contain a metal having a small grain size, and thus may have smooth surfaces and improved straightness.

In the display device according to one embodiment including the wiring substrate, a step coverage defect of an insulating layer disposed between conductive layers may be reduced, and a burnt defect and a short circuit between wires may be prevented.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment, a display device may include a substrate including a display area and a pad area disposed on a side of the display area; conductive layers including wires and conductive patterns disposed in the display area and the pad area; a via layer disposed on the conductive layers; a first electrode and a second electrode disposed on the via layer in the display area, the first electrode and the second electrode being spaced apart from each other; a first insulating layer disposed on the first electrode and the second electrode; light emitting elements disposed on the first electrode and the second electrode, the light emitting elements being spaced apart from each other on the first insulating layer; a first connection electrode disposed on the first electrode and electrically contacting the light emitting elements; and a second connection electrode disposed on the second electrode and electrically contacting the light emitting elements, wherein each of the conductive layers may include a first metal layer and a second metal layer disposed on the first metal layer, and the second metal layer contains copper (Cu) and has a grain size of about 155 nm or less.

The second metal layer may have a resistivity of about 2.3 µΩcm or less.

The first metal layer may have a thickness of about 500 Å or less, and the second metal layer may have a thickness in a range of about 3000 Å to about 17000 Å.

The first metal layer may include titanium (Ti), and the second metal layer may include a copper alloy containing copper (Cu) as a main component and including at least one of silver (Ag), magnesium (Mg), aluminum (Al), indium (In), niobium (Nb), and boron (B) as an impurity metal.

The second metal layer may include the impurity metal at a content of about 5 at % or less.

The second metal layer may include copper grains of a random grain orientation.

The first metal layer may include a titanium alloy containing titanium (Ti) as a main component and containing zinc (Zn) as an impurity metal, or a copper alloy containing copper (Cu) as a main component and containing at least one of silver (Ag), magnesium (Mg), aluminum (Al), indium (In), niobium (Nb), and boron (B) as an impurity metal.

The first metal layer may be made of at least one of zinc oxide (ZnO) and indium-zinc oxide (IZO).

The conductive layer may include a first conductive layer including a lower metal layer disposed in the display area; and a first pad wire disposed in the pad area; a second conductive layer including gate electrodes disposed in the display area on the first conductive layer; and a second pad wire disposed in the pad area; and a third conductive layer including a first conductive pattern disposed in the display area on the second conductive layer; and a pad electrode lower layer disposed in the pad area, and the via layer may include a pad electrode upper layer disposed on the third conductive layer in the display area and disposed on the pad electrode lower layer in the pad area, and a pad electrode capping layer disposed on the pad electrode upper layer.

The display device may further include a first gate insulating layer disposed between the first conductive layer and the second conductive layer; a first interlayer insulating layer disposed between the second conductive layer and the third conductive layer; and a first passivation layer disposed on the third conductive layer, wherein each of the first gate insulating layer, the first interlayer insulating layer, and the first passivation layer may include an inorganic insulating material.

The pad electrode upper layer, the first electrode, and the second electrode may include a same material, and the pad electrode capping layer, the first connection electrode, and the second connection electrode may include a same material.

The conductive layer may further include a fourth conductive layer disposed on the third conductive layer, and including a first voltage line and a second voltage line, the display device may further include a second interlayer insulating layer disposed on the first passivation layer; and a second passivation layer disposed on the fourth conductive layer.

The via layer may include trenches exposing a part of a top surface of the second passivation layer, at least a part of the first electrode and the second electrode may be disposed directly on the second passivation layer in the trenches, and the light emitting elements may be disposed in the trenches.

According to an embodiment, a wiring substrate may include conductive layers including wires and conductive patterns disposed on a substrate; and at least one insulating layer disposed between the conductive layers, wherein the conductive layers may include a first metal layer and a second metal layer disposed on the first metal layer, the second metal layer may contain copper (Cu), the second metal layer may have a grain size of about 155 nm or less, and the second metal layer may have a resistivity of about 2.3 μΩcm or less.

The first metal layer may have a thickness of about 500 Å or less, and the second metal layer may have a thickness in a range of about 3000 Å to about 17000 Å.

The first metal layer may include titanium (Ti), and the second metal layer may include a copper alloy containing copper (Cu) as a main component and including at least one of silver (Ag), magnesium (Mg), aluminum (Al), indium (In), niobium (Nb), and boron (B) as an impurity metal.

The second metal layer may include the impurity metal at a content of about 5 at % or less.

The second metal layer may include copper grains of a random grain orientation.

The first metal layer may include a titanium alloy containing titanium (Ti) as a main component and containing zinc (Zn) as an impurity metal, or a copper alloy containing copper (Cu) as a main component and containing at least one of silver (Ag), magnesium (Mg), aluminum (Al), indium (In), niobium (Nb), and boron (B) as an impurity metal.

The first metal layer may be made of at least one of zinc oxide (ZnO) and indium-zinc oxide (IZO).

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
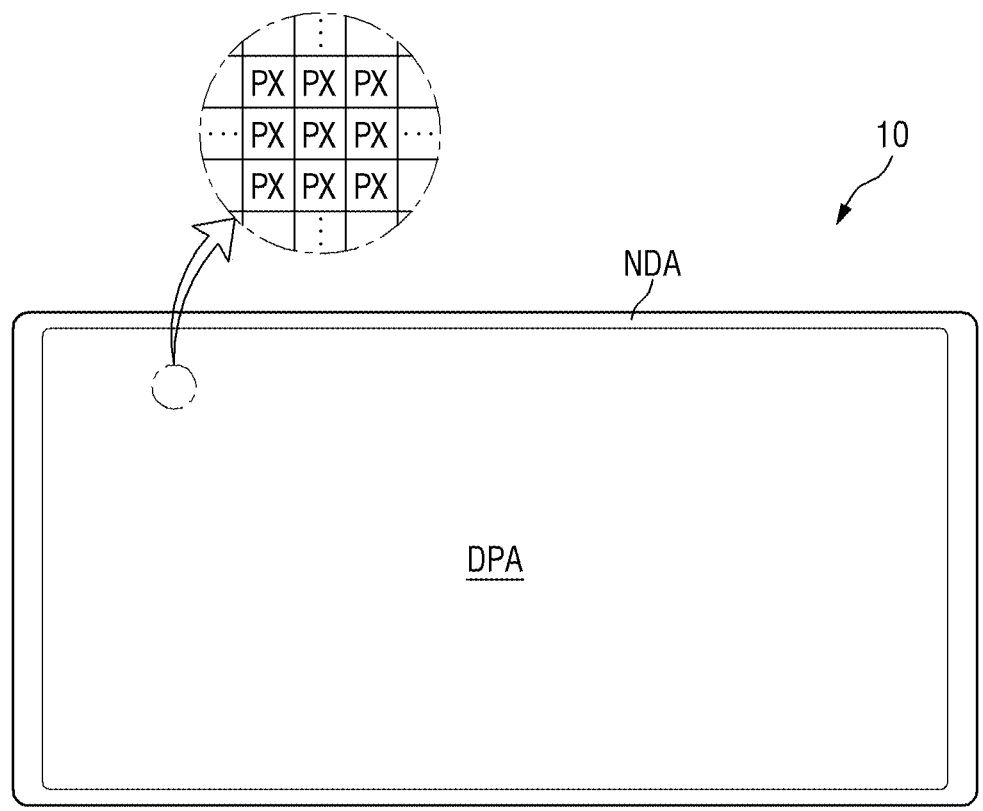
FIG. 1 is a schematic plan view of a display device according to one embodiment.
Figure 1:
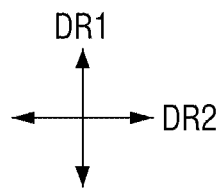

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic plan view of a display device according to one embodiment.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 may include a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be described, but the disclosure is not limited thereto, and other display panels may be applied within the same scope of technical spirit.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape and a circular shape. The shape of a display area DPA of the display device 10 may also be similar to the overall shape of the display device 10. FIG. 1 illustrates a display device 10 having a rectangular shape elongated in a second direction DR2. It is to be understood that the shapes disclosed herein may include shapes substantially identical or similar to the shapes.

The display device 10 may include the display area DPA and a non-display area NDA. The display area DPA may be an area where a screen can be displayed, and the non-display area NDA may be an area where a screen is not displayed. The display area DPA may also be referred to as an active region, and the non-display area NDA may also be referred to as a non-active region. The display area DPA may substantially occupy the center of the display device 10.

The display area DPA may include pixels PX. The pixels PX may be arranged (or disposed) in a matrix. The shape of each pixel PX may be a rectangular or square shape in a plan view. However, the disclosure is not limited thereto, and it may be a rhombic shape in which each side is inclined with respect to one direction or a direction. The pixels PX may be arranged in a stripe type or an island type. Each of the pixels PX may include one or more light emitting elements that emit light of a specific or given wavelength band to display a specific or given color.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
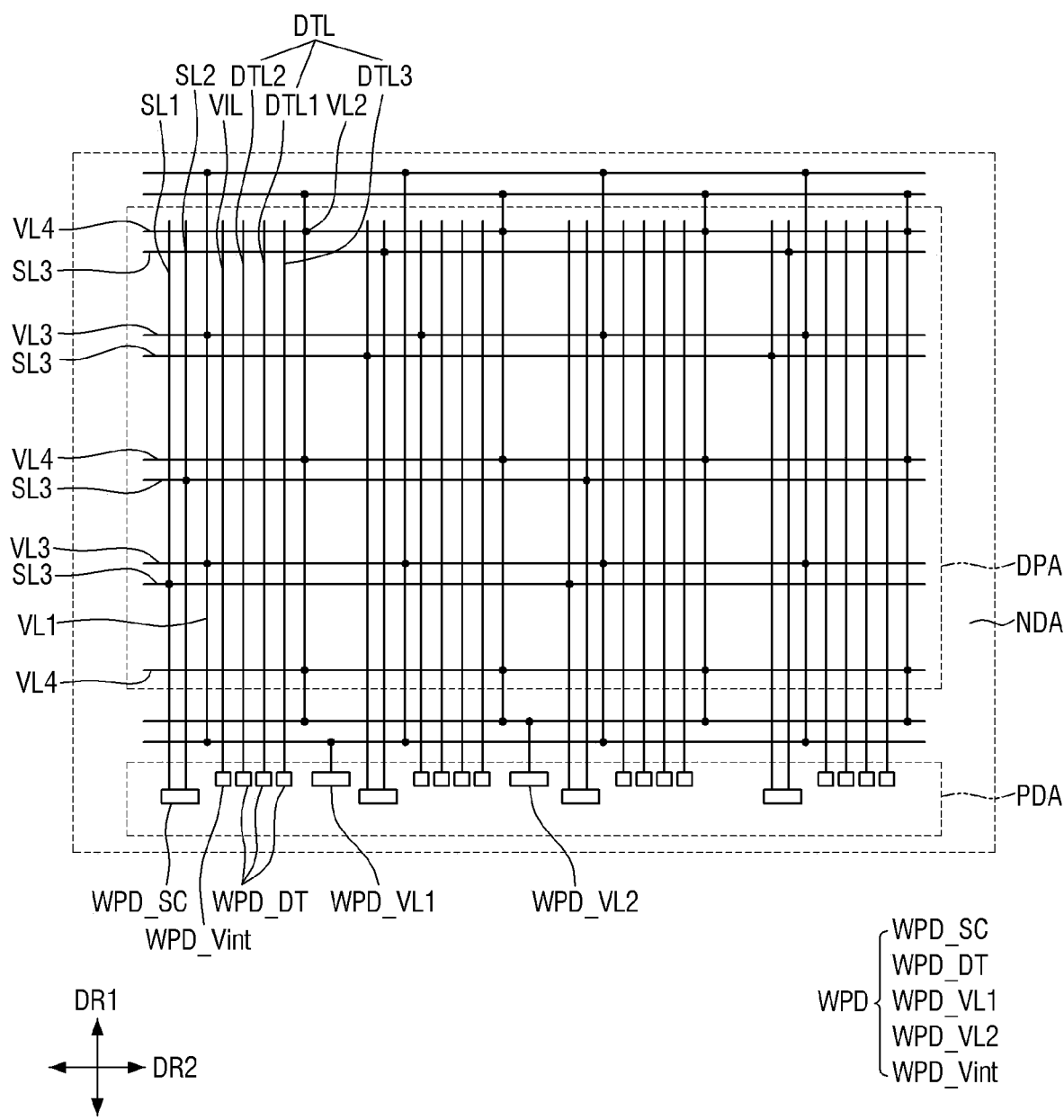
FIG. 2 is a schematic plan view showing arrangement of wires included in a display device according to one embodiment.

FIG. 2 is a schematic plan view showing arrangement of wires included in a display device according to one embodiment.

Referring to FIG. 2, the display device 10 may include wires. The display device 10 may include scan lines SL1, SL2, and SL3, data lines DTL1, DTL2, and DTL3, an initialization voltage line VIL, and voltage lines VL1, VL2, VL3, and VL4. Although not shown in the drawing, other wires may be further provided in the display device 10.

The first scan line SL1 and the second scan line SL2 may be disposed to extend in the first direction DR1. The first scan line SL1 and the second scan line SL2 may be disposed adjacent to each other, and may be disposed to be spaced apart from the different first scan line SL1 and second scan line SL2 in the second direction DR2. The first scan line SL1 and the second scan line SL2 may be connected to a scan wire pad WPD_SC connected to a scan driver (not illustrated). The first scan line SL1 and the second scan line SL2 may be disposed to extend from the pad area PDA disposed in the non-display area NDA to the display area DPA.

The third scan line SL3 may be disposed to extend in the second direction DR2, and may be disposed to be spaced apart from the other third scan line SL3 in the first direction DR1. One third scan line SL3 may be connected to one or more first scan lines SL1 or one or more second scan lines SL2. In one embodiment, the first scan line SL1 and the second scan line SL2 may be formed as a conductive layer disposed in a different layer from the third scan line SL3. The scan lines SL may have a mesh structure in the entire surface of the display area DPA, but is not limited thereto.

The term "connected" as used herein may mean not only that one member is connected to another member through a physical contact, but also that one member is connected to another member through yet another member. This may also be understood as one part and the other part as integral elements are connected into an integrated element via another element. Furthermore, if one element is connected to another element, this may be construed as a meaning including an electrical connection via another element in addition to a direct connection in physical contact.

Data lines DTL may be disposed to extend in the first direction DR1. The data line DTL may include a first data line DTL1, a second data line DTL2, and a third data line DTL3, and each one of the first to third data lines DTL1, DTL2, and DTL3 forms a pair and is disposed adjacent to each other. Each of the data lines DTL1, DTL2, and DTL3 may be disposed to extend from the pad area PDA disposed in the non-display area NDA to the display area DPA. However, the disclosure is not limited thereto, and the data lines DTL may be disposed to be spaced apart from each other at equal intervals between a first voltage line VL1 and a second voltage line VL2 to be described later.

The initialization voltage line VIL may be disposed to extend in the first direction DR1. The initialization voltage line VIL may be disposed between the data lines DTL and the first and second scan lines SL1 and SL2. The initialization voltage line VIL may be disposed to extend from the pad area PDA disposed in the non-display area NDA to the display area DPA.

The first voltage line VL1 and the second voltage line VL2 extend in the first direction DR1, and a third voltage line VL3 and a fourth voltage line VL4 extend in the second direction DR2. The first voltage line VL1 and the second voltage line VL2 may be alternately disposed in the second direction DR2, and the third voltage line VL3 and the fourth voltage line VL4 may be alternately disposed in the first direction DR1. The first voltage line VL1 and the second voltage line VL2 may be disposed to extend in the first direction DR1 to cross or intersect the display area DPA, and as for the third voltage line VL3 and the fourth voltage line VL4, some or a number of the wires may be disposed in the display area DPA and other wires may be disposed in the non-display area NDA positioned on both sides of the display area DPA in the first direction DR1, respectively. The first voltage line VL1 and the second voltage line VL2 may be formed as a conductive layer disposed on a different layer from the third voltage line VL3 and the fourth voltage line VL4. The first voltage line VL1 may be connected to at least one third voltage line VL3, and the second voltage line VL2 may be connected to at least one fourth voltage line VL4. The voltage lines VL may have a mesh structure in the entire display area DPA. However, the disclosure is not limited thereto.

The first scan line SL1, the second scan line SL2, the data line DTL, the initialization voltage line VIL, the first voltage line VL1, and the second voltage line VL2 may be electrically connected to at least one wire pad WPD. Each wire pad WPD may be disposed in the non-display area NDA. In one embodiment, each of the wire pads WPD may be disposed in the pad area PDA positioned on the lower side, which is the other side of the display area DPA in the first direction DR1. The first scan line SL1 and the second scan line SL2 are connected to the scan wire pad WPD_SC disposed in the pad area PDA, and the data lines DTL are connected to the data wire pads WPD_DT different from each other, respectively. The initialization voltage line VIL is connected to an initialization wire pad WPD_Vint, the first voltage line VL1 is connected to a first voltage wire pad WPD_VL1, and the second voltage line VL2 is connected to a second voltage wire pad WPD_VL2. The external devices may be mounted on the wire pads WPD. The external devices may be mounted on the wire pads WPD by applying an anisotropic conductive film, ultrasonic bonding or the like within the spirit and the scope of the disclosure. The drawing illustrates that each of the wire pads WPD is disposed on the pad area PDA disposed on the lower side of the display area DPA, but is not limited thereto. Some or a number of the wire pads WPD may be disposed in any one area on the upper side or on the left and right sides of the display area DPA.

Each pixel PX or sub-pixel SPXn (n is an integer of 1 to 3) of the display device 10 may include a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may be variously modified. According to one embodiment, in each sub-pixel SPXn of the display device 10, the pixel driving circuit may have a 3T1C structure including three transistors and one capacitor. Hereinafter, the pixel driving circuit of the 3T1C structure will be described as an example, but the disclosure is not limited thereto, and various other modified structures such as a 2T1C structure, a 7T1C structure, and a 6T1C structure may be applied.

Figure 3:
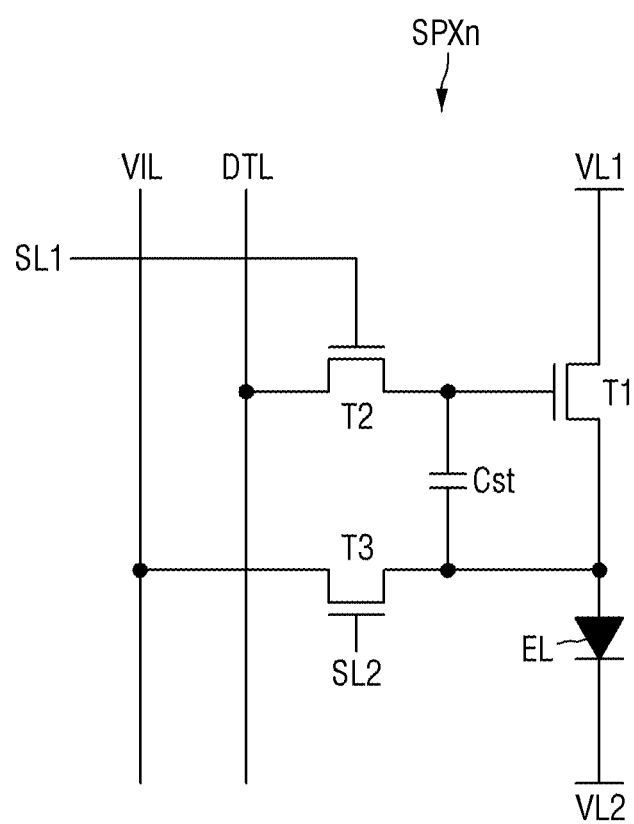
FIG. 3 is schematic diagram of an equivalent circuit of a sub-pixel according to one embodiment.

FIG. 3 is schematic diagram of an equivalent circuit of a sub-pixel according to one embodiment.

Referring to FIG. 3, each sub-pixel SPXn of the display device 10 according to one embodiment may include three transistors T1, T2 and T3 and one storage capacitor Cst in addition to a light emitting diode EL.

The light emitting diode EL emits light by a current supplied through a first transistor T1. The light emitting diode EL may include a first electrode, a second electrode, and at least one light emitting element disposed between them. The light emitting element may emit light of a specific or given wavelength band by electrical signals transmitted from the first electrode and the second electrode.

One end of the light emitting diode EL may be connected to the source electrode of the first transistor T1, and the other end thereof may be connected to the second voltage line VL2 to which a low potential voltage (hereinafter, a second power voltage) lower than a high potential voltage (hereinafter, a first power voltage) of the first voltage line VL1 is supplied.

The first transistor T1 adjusts a current flowing from the first voltage line VL1, to which the first power voltage is supplied, to the light emitting diode EL according to the voltage difference between the gate electrode and the source electrode. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VL1 to which the first power voltage is applied.

The second transistor T2 is turned on by a scan signal of a first scan line SL1 to connect the data line DTL to the gate electrode of the first transistor T1. The gate electrode of the second transistor T2 may be connected to the first scan line SL1, the source electrode thereof may be connected to the gate electrode of the first transistor T1, and the drain electrode thereof may be connected to the data line DTL.

The third transistor T3 is turned on by a scan signal of the second scan line SL2 to connect the initialization voltage line VIL to one end of the light emitting diode EL. The gate electrode of the third transistor T3 may be connected to the second scan line SL2, the drain electrode thereof may be connected to the initialization voltage line VIL, and the source electrode thereof may be connected to one end of the light emitting diode EL or to the source electrode of the first transistor T1.

In one embodiment, the source electrode and the drain electrode of each of the transistors T1, T2, and T3 are not limited to those described above, and vice versa. Further, each of the transistors T1, T2, and T3 may be formed of a thin film transistor. In FIG. 3, each of the transistors T1, T2, and T3 has been described as being formed of an N-type metal oxide semiconductor field effect transistor (MOSFET), but is not limited thereto. For example, each of the transistors T1, T2, and T3 may be formed of a P-type MOSFET. For example, some or a number of the transistors T1, T2, and T3 may be formed of an N-type MOSFET and the others may be formed of a P-type MOSFET.

The storage capacitor Cst is formed between the gate electrode and the source electrode of the first transistor T1. The storage capacitor Cst stores a difference voltage between a gate voltage and a source voltage of the first transistor T1.

Hereinafter, a structure of one pixel PX of the display device 10 according to one embodiment will be described in detail with further reference to other drawings.

Figure 4:
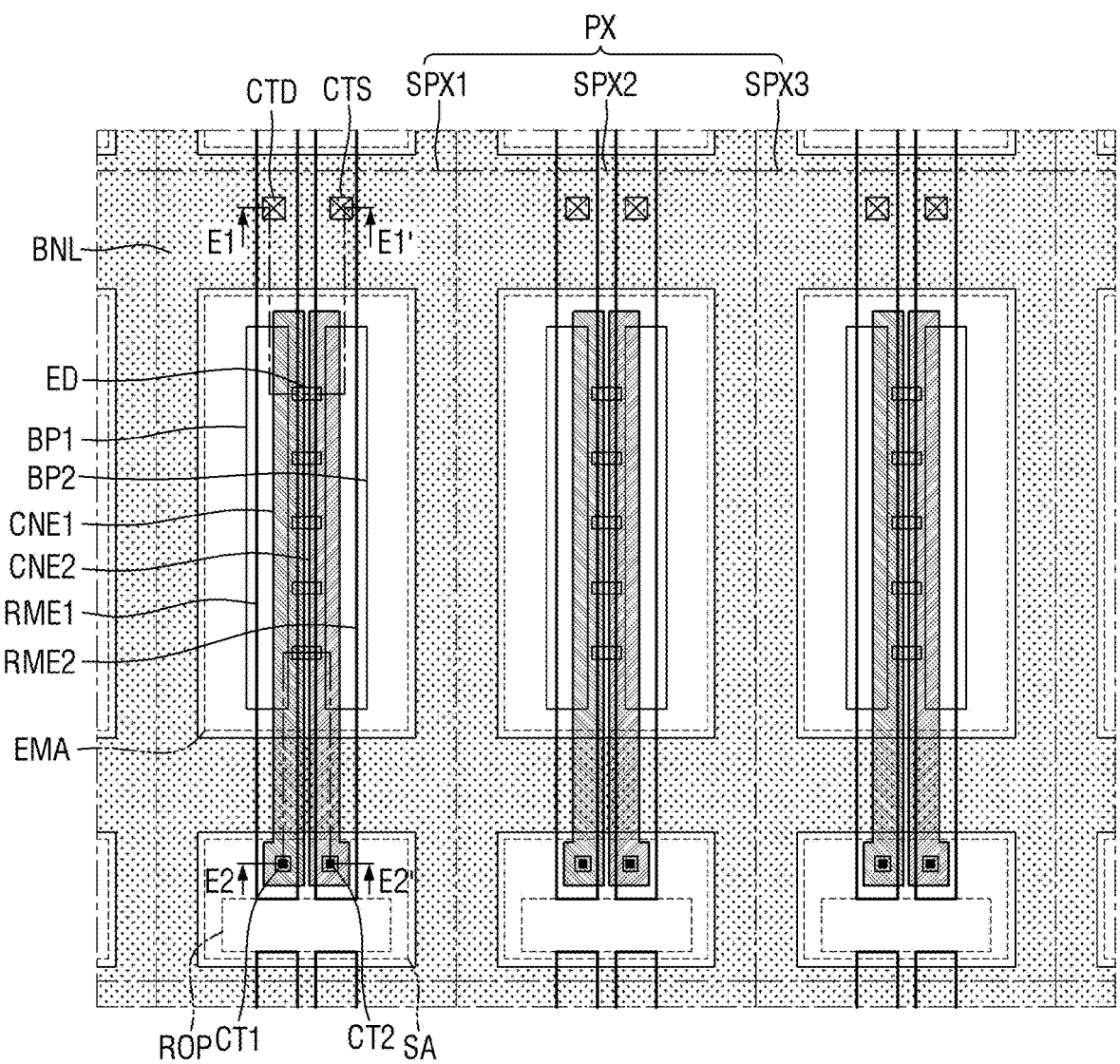
FIG. 4 is a schematic plan view illustrating one pixel of a display device according to one embodiment.

FIG. 4 is a schematic plan view illustrating one pixel of a display device according to one embodiment. FIG. 4 illustrates planar arrangement of electrodes RME (RME1 and RME2), bank patterns BP1 and BP2, a bank layer BNL, light emitting elements ED, and connection electrodes CNE (CNE1 and CNE2) disposed in one pixel PX of the display device 10.

Referring to FIG. 4, each of the pixels PX of the display device 10 may include sub-pixels SPXn. For example, one pixel PX may include a first sub-pixel SPX1, a second sub-pixel SPX2 and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the disclosure is not limited thereto, and the sub-pixels SPXn may emit light of the same color. In one embodiment, each of the sub-pixels SPXn may emit blue light. Although it is illustrated in the drawing that one pixel PX may include three sub-pixels SPXn, the disclosure is not limited thereto, and the pixel PX may include a larger number of sub-pixels SPXn.

Each sub-pixel SPXn of the display device 10 may include an emission area EMA and a non-emission area. The emission area EMA may be an area in which the light emitting element ED is disposed to emit light of a specific or given wavelength band. The non-emission area may be a region in which the light emitting element ED is not disposed and a region from which light is not emitted because light emitted from the light emitting element ED does not reach it.

The emission area EMA may include a region in which the light emitting element ED is disposed, and a region adjacent to the light emitting element ED and from which lights emitted from the light emitting element ED are emitted. For example, the emission area EMA may further include a region in which the light emitted from the light emitting element ED is reflected or refracted by another member and emitted. The light emitting elements ED may be disposed in each sub-pixel SPXn, and the emission area may be formed to include an area where the light emitting elements ED are disposed and an area adjacent thereto.

Although it is shown in the drawing that the sub-pixels SPXn have the emission areas EMA that are substantially identical in size, the disclosure is not limited thereto. In an embodiment, the emission areas EMA of the sub-pixels SPXn may have different sizes according to a color or wavelength band of light emitted from the light emitting element ED disposed in each sub-pixel.

Each sub-pixel SPXn may further include a sub-region SA disposed in the non-emission area. The sub-region SA of the corresponding sub-pixel SPXn may be disposed on the lower side, which is the other side of the emission area EMA in the first direction DR1. The emission area EMA and the sub-region SA may be alternately arranged along the first direction DR1, and the sub-region SA may be disposed between the emission areas EMA of different sub-pixels SPXn spaced apart from each other in the first direction DR1. For example, the emission area EMA and the sub-region SA may be alternately arranged in the first direction DR1, and each of the emission area EMA and the sub-region SA may be repeatedly arranged in the second direction DR2. However, the disclosure is not limited thereto, and the arrangement of the emission areas EMA and the sub-regions SA in the pixels PX may be different from that shown in FIG. 4.

Light may not be emitted from the sub-region SA because the light emitting element ED is not disposed in the sub-region SA, but an electrode RME disposed in each sub-pixel SPXn may be partially disposed in the sub-region SA. The electrodes RME disposed in different sub-pixels SPXn may be disposed to be separated at a separation portion ROP of the sub-region SA.

Each of the wires and the circuit elements of a circuit layer disposed on each pixel PX and connected to the light emitting diode EL may be connected to the first to third sub-pixels SPX1, SPX2, and SPX3. However, the wires and the circuit elements may not be disposed to correspond to the area occupied by each sub-pixel SPXn or the emission area EMA, and may be disposed regardless of the position of the emission area EMA within one pixel PX.

The bank layer BNL may be disposed to surround the sub-pixels SPXn, the emission area EMA, and the sub-region SA. The bank layer BNL may be disposed at the boundary of the sub-pixels SPXn adjacent in the first direction DR1 and the second direction DR2, and may also be disposed at the boundary of the emission area EMA and the sub-region SA. The sub-pixels SPXn, the emission area EMA, and the sub-region SA of the display device 10 may be distinguished by the arrangement of the bank layer BNL. The gaps between the sub-pixels SPXn, the emission areas EMA, and the sub-regions SA may vary depending on the width of the bank layer BNL.

The bank layer BNL may include portions extending in the first direction DR1 and the second direction DR2 in a plan view to be arranged in a grid pattern over the entire surface of the display area DPA. The bank layer BNL may be disposed along the boundaries between the sub-pixels SPXn to delimit the neighboring sub-pixels SPXn. Further, the bank layer BNL may be disposed to surround the emission area EMA and the sub-region SA disposed for each sub-pixel SPXn to distinguish them.

Figure 5:
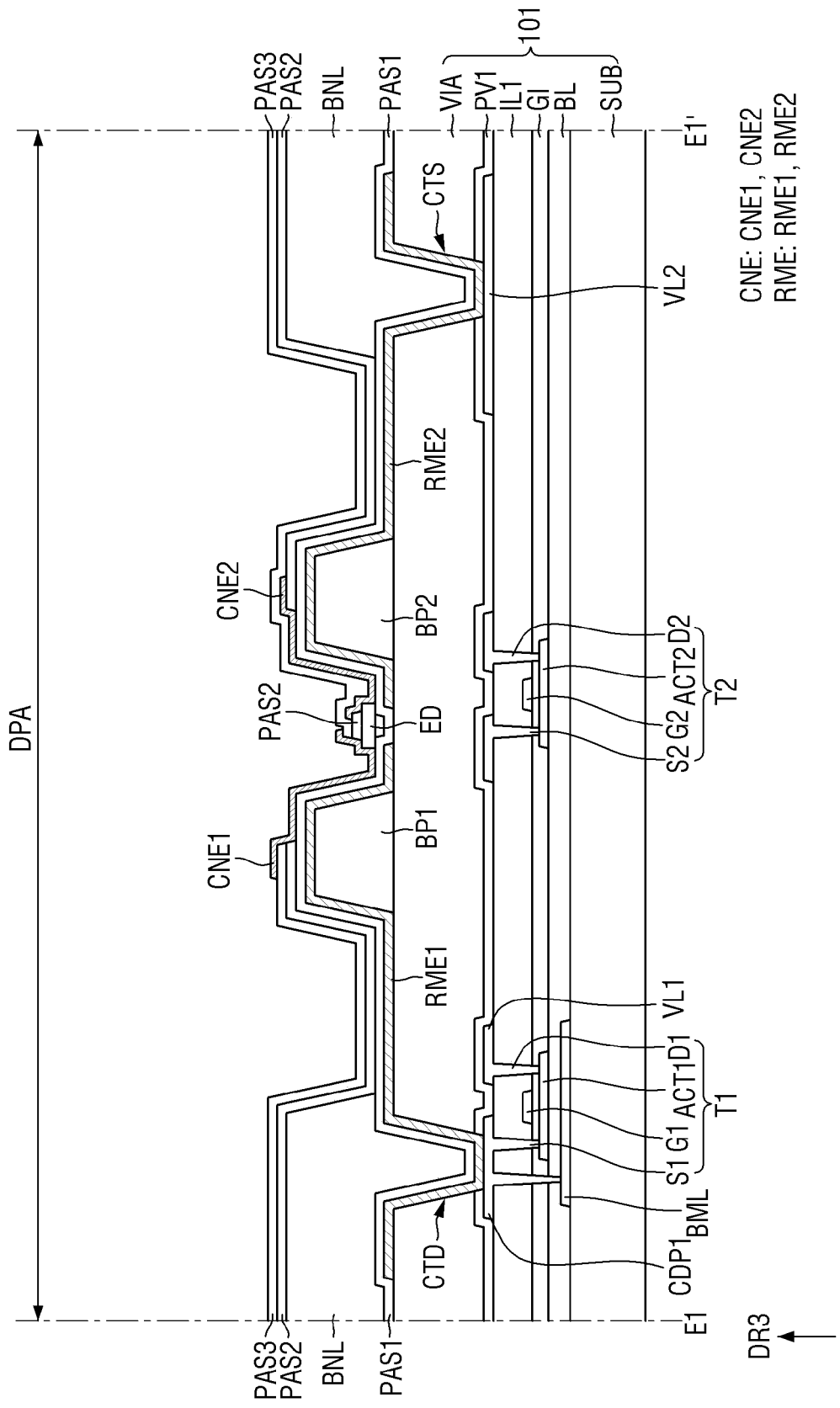
FIG. 5 is a schematic cross-sectional view taken along line E1-E1' of FIG. 4.
Figure 6:
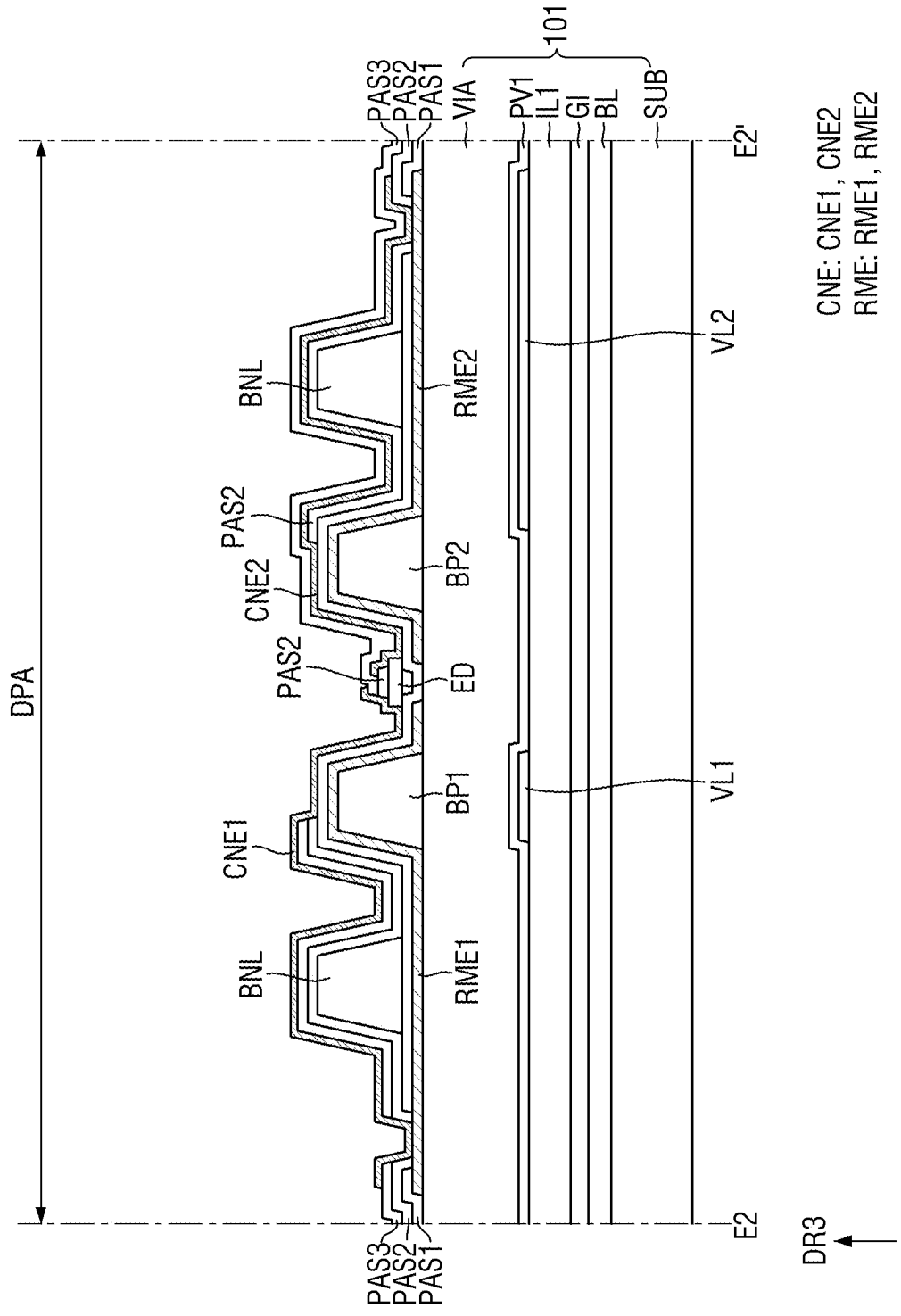
FIG. 6 is a schematic cross-sectional view taken along line E2-E2' of FIG. 4.

FIG. 5 is a schematic cross-sectional view taken along line E1-E1' of FIG. 4. FIG. 6 is a schematic cross-sectional view taken along line E2-E2' of FIG. 4. FIG. 5 illustrates a cross section across both ends of the light emitting element ED and electrode contact holes CTD and CTS disposed in the first sub-pixel SPX1, and FIG. 6 illustrates a cross section across both ends of the light emitting element ED and contact portions CT1 and CT2 disposed in the first sub-pixel SPX1.

Referring to FIGS. 5 and 6 in conjunction with FIG. 4, the display device 10 may include a wiring substrate 101 including a first substrate SUB, and a semiconductor layer, conductive layers, and insulating layers that are disposed on the first substrate SUB. Further, the display device 10 may include the electrodes RME (RME1 and RME2), the light emitting element ED, and connection electrodes CNE (CNE1 and CNE2) that are disposed on the wiring substrate 101. The semiconductor layer, the conductive layers, and the insulating layers of the wiring substrate 101 may each constitute a circuit layer of the display device 10.

The first substrate SUB may be an insulating substrate. The first substrate SUB may be made of an insulating material such as glass, quartz, or polymer resin. Further, the first substrate SUB may be a rigid substrate, but may also be a flexible substrate which can be bent, folded or rolled. The first substrate SUB may include the display area DPA and the non-display area NDA surrounding the display area DPA, and the display area DPA may include the emission area EMA and the sub-region SA that is a part of the non-emission area.

A first conductive layer may be disposed on the first substrate SUB. The first conductive layer may include a lower metal layer BML that is disposed to overlap an active layer ACT1 of a first transistor T1. The lower metal layer BML may include a material of blocking light to prevent light from reaching the active layer ACT1 of the first transistor T1. However, the lower metal layer BML may be omitted.

The buffer layer BL may be disposed on the lower metal layer BML and the first substrate SUB. The buffer layer BL may be formed on the first substrate SUB to protect the transistors of the pixel PX from moisture permeating through the first substrate SUB susceptible to moisture permeation, and may perform a surface planarization function.

The semiconductor layer is disposed on the buffer layer BL. The semiconductor layer may include the first active layer ACT1 of the first transistor Ti and a second active layer ACT2 of the second transistor T2. The first active layer ACT1 and the second active layer ACT2 may be disposed to partially overlap a first gate electrode G1 and a second gate electrode G2 of the second conductive layer to be described later, respectively.

The semiconductor layer may include polycrystalline silicon, monocrystalline silicon, oxide semiconductor, and the like within the spirit and the scope of the disclosure. In an embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

Although it is illustrated in the drawing that one first transistor T1 is disposed in the sub-pixel SPXn of the display device 10, but the disclosure is not limited thereto, and the display device 10 may include a larger number of transistors.

The first gate insulating layer GI is disposed on the semiconductor layer and the buffer layer BL. The first gate insulating layer GI may serve as a gate insulating layer of each of the transistors T1 and T2. Although it is illustrated in the drawing that the first gate insulating layer GI is disposed on the entire buffer layer BL, the disclosure is not limited thereto. In an embodiment, the first gate insulating layer GI may be patterned together with the gate electrodes G1 and G2 of the second conductive layer to be described later to be partially disposed between the second conductive layer and the active layers ACT1 and ACT2 of the semiconductor layer.

The second conductive layer is disposed on the first gate insulating layer GI. The second conductive layer may include a first gate electrode G1 of the first transistor T1 and a second gate electrode G2 of the second transistor T2. The first gate electrode G1 may be disposed to overlap the channel region of the first active layer ACT1 in the third direction DR3 that is a thickness direction, and the second gate electrode G2 may be disposed to overlap the channel region of the second active layer ACT2 in the third direction DR3 that is the thickness direction. Although not shown in the drawing, the second conductive layer may further include one electrode of the storage capacitor.

A first interlayer insulating layer IL1 is disposed on the second conductive layer. The first interlayer insulating layer IL1 may function as an insulating layer between the second conductive layer and other layers disposed thereon, and may protect the second conductive layer.

A third conductive layer is disposed on the first interlayer insulating layer IL1. The third conductive layer may include the first voltage line VL1, the second voltage line VL2, a first conductive pattern CDP1, and source electrodes S1 and S2 and drain electrodes D1 and D2 of the respective transistors T1 and T2 that are disposed in the display area DPA. Although not shown in the drawing, the third conductive layer may further include the other electrode of the storage capacitor.

The first voltage line VL1 may be applied with a high potential voltage (or a first power voltage) transmitted to the first electrode RME1, and the second voltage line VL2 may be applied with a low potential voltage (or a second power voltage) transmitted to the second electrode RME2. A part of the first voltage line VL1 may be in contact with the first active layer ACT1 of the first transistor Ti through the contact hole penetrating the first interlayer insulating layer IL1 and the first gate insulating layer GI. The first voltage line VL1 may serve as a first drain electrode D1 of the first transistor T1. The second voltage line VL2 may be connected to or directly connected to the second electrode RME2 to be described later.

The first conductive pattern CDP may be in contact with the first active layer ACT1 of the first transistor T1 through the contact hole penetrating the first interlayer insulating layer IL1 and the first gate insulating layer GI. The first conductive pattern CDP may be in contact with the lower metal layer BML, through another contact hole. The first conductive pattern CDP may serve as a first source electrode S1 of the first transistor T1. Further, the first conductive pattern CDP1 may be connected to the first electrode RME1 or the first connection electrode CNE1 to be described later. The first transistor T1 may transmit the first power voltage applied from the first voltage line VL1 to the first electrode RME1 or the first connection electrode CNE1.

The second source electrode S2 and the second drain electrode D2 may be in contact with the second active layer ACT2 of the second transistor T2 through contact holes penetrating the first interlayer insulating layer IL1 and the first gate insulating layer GI. The second transistor T2 may be any one of the switching transistors described with reference to FIG. 3. The second transistor T2 may transmit the signal applied from the data line DTL of FIG. 3 to the first transistor T1, or may transmit the signal applied from the initialization voltage line VIL of FIG. 3 to the other electrode of the storage capacitor.

A first passivation layer PV1 is disposed on the third conductive layer. The first passivation layer PV1 may function as an insulating layer between the third conductive layer and other layers and may protect the third conductive layer.

The buffer layer BL, the first gate insulating layer GI, the first interlayer insulating layer IL1, and the first passivation layer PV1 described above may be formed of inorganic layers stacked each other in an alternating manner. For example, the buffer layer BL, the first gate insulating layer GI, the first interlayer insulating layer IL1, and the first passivation layer PV1 may be formed as a double layer formed by stacking, or a multilayer formed by alternately stacking, inorganic layers including at least one of silicon oxide (SiOx), silicon nitride (SiNx), or silicon oxynitride (SiOxNy). However, the disclosure is not limited thereto, and the buffer layer BL, the first gate insulating layer GI, the first interlayer insulating layer IL1, and the first passivation layer PV1 may be formed as a single inorganic layer containing the above-described insulating material. Further, in an embodiment, the first interlayer insulating layer IL1 may be made of an organic insulating material such as polyimide (PI) or the like within the spirit and the scope of the disclosure.

A via layer VIA is disposed on the third conductive layer in the display area DPA. The via layer VIA may contain an organic insulating material, for example, polyimide (PI), and may compensate stepped portions formed by the conductive layers disposed thereunder to flatten the top surface. However, in an embodiment, the via layer VIA may be omitted.

The display device 10 may include, as a display element layer disposed on the via layer VIA of the wiring substrate 101, the bank patterns BP1 and BP2, the electrodes RME (RME1 and RME2), the bank layer BNL, the light emitting elements ED, and the connection electrodes CNE (CNE1 and CNE2). Further, the display device 10 may include insulating layers PAS1, PAS2, and PAS3 disposed on the wiring substrate 101.

The bank patterns BP1 and BP2 may be disposed in the emission area EMA of each sub-pixel SPXn. The bank patterns BP1 and BP2 may have a width in the second direction DR2 and may have a shape extending in the first direction DR1.

For example, the bank patterns BP1 and BP2 may include a first bank pattern BP1 and a second bank pattern BP2 spaced apart from each other in the second direction DR2 in the emission area EMA of each sub-pixel SPXn. The first bank pattern BP1 may be disposed on the left side that is one side or a side in the second direction DR2 with respect to the center of the emission area EMA, and the second bank pattern BP2 may be disposed on the right side that is the other side in the second direction DR2 with respect to the center of the emission area EMA while being spaced apart from the first bank pattern BP1. The first bank pattern BP1 and the second bank pattern BP2 may be alternately disposed along the second direction DR2 and may be disposed in an island-like pattern in the display area DPA. The light emitting elements ED may be arranged between the first bank pattern BP1 and the second bank pattern BP2.

The first bank pattern BP1 and the second bank pattern BP2 may have the same length in the first direction DR1, and the length thereof in the first direction DR1 may be smaller than the length of the emission area EMA surrounded by the bank layer BNL in the first direction DR1. The first bank pattern BP1 and the second bank pattern BP2 may be spaced apart from a portion of the bank layer BNL extending in the second direction DR2. However, the disclosure is not limited thereto, and the bank patterns BP1 and BP2 and the bank layer BNL may be integral with each other or may partially overlap the portion of the bank layer BNL extending in the second direction DR2. The length of the bank patterns BP1 and BP2 in the first direction DR1 may be greater than or equal to the length of the emission area EMA surrounded by the bank layer BNL in the first direction DR1.

The first bank pattern BP1 and the second bank pattern BP2 may have the same width in the second direction DR2. However, the disclosure is not limited thereto, and the first bank pattern BP1 and the second bank pattern BP2 may have different widths. For example, one bank pattern may have a width greater than that of the other bank pattern, and the bank pattern having the greater width may be disposed across the emission areas EMA of other sub-pixels SPXn adjacent in the second direction DR2. The bank pattern disposed across the emission areas EMA may overlap a portion of the bank layer BNL extending in the first direction DR1 in the thickness direction. Although it is illustrated in the drawing that two bank patterns BP1 and BP2 having the same width are arranged for each sub-pixel SPXn, the disclosure is not limited thereto. The number and the shape of the bank patterns BP1 and BP2 may vary depending on the number or the arrangement structure of the electrodes RME.

The bank patterns BP1 and BP2 may be disposed on the via layer VIA. For example, the bank patterns BP1 and BP2 may be disposed on or directly disposed on the via layer VIA, and may have a structure in which at least a part thereof protrudes with respect to the top surface of the via layer VIA. The protruding parts of the bank patterns BP1 and BP2 may have inclined or curved side surfaces, and the light emitted from the light emitting element ED may be reflected by the electrode RME disposed on the bank patterns BP1 and BP2 and emitted in an upward direction of the via layer VIA. Unlike the illustrated example in the drawings, the bank patterns BP1 and BP2 may have a shape of a semi-circle or semi-ellipse whose outer surface is curved in cross-sectional view. The bank patterns BP1 and BP2 may include an organic insulating material such as polyimide (PI), but is not limited thereto.

The electrodes RME (RME1 and RME2) have a shape extending in one direction or a direction and are disposed for each sub-pixel SPXn. The electrodes RME1 and RME2 may extend in the first direction DR1 to be disposed across the emission area EMA of the sub-pixel SPXn and the sub-region SA, and may be disposed to be spaced apart from each other in the second direction DR2. The electrodes RME may be electrically connected to the light emitting element ED to be described later. However, the disclosure is not limited thereto, and the electrodes RME may not be electrically connected to the light emitting element ED.

The display device 10 may include the first electrode RME1 and the second electrode RME2 arranged in each sub-pixel SPXn. The first electrode RME1 is located (or disposed) on the left side with respect to the center of the emission area EMA, and the second electrode RME2 is located on the right side with respect to the center of the emission area EMA while being spaced apart from the first electrode RME1 in the second direction DR2. A first electrode RME1 may be disposed on the first bank pattern BP1, and a second electrode RME2 may be disposed on the second bank pattern BP2. The first electrode RME1 and the second electrode RME2 may be partially arranged in the corresponding sub-pixel SPXn and the sub-region SA over the bank layer BNL. The first electrode RME1 and the second electrode RME2 of different sub-pixels SPXn may be separated with respect to the separation portion ROP located in the sub-region SA of one sub-pixel SPXn.

Although it is illustrated in the drawing that the two electrodes RME have a shape extending in the first direction DR1 in each sub-pixel SPXn, the disclosure is not limited thereto. For example, the display device 10 may have a shape in which a larger number of electrodes RME are disposed in one sub-pixel SPXn or the electrodes RME may have a shape that is partially bent and has different widths depending on positions.

The first electrode RME1 and the second electrode RME2 may be arranged at least on the inclined surfaces of the bank patterns BP1 and BP2. In one embodiment, the width of the electrodes RME measured in the second direction DR2 may be smaller than the width of the bank patterns BP1 and BP2 measured in the second direction DR2, and the gap between the first electrode RME1 and the second electrode RME2 in the second direction DR2 may be smaller than the gap between the bank patterns BP1 and BP2. At least a part of the first electrode RME1 and the second electrode RME2 may be arranged on or directly arranged on the via layer VIA, so that the first electrode RME1 and the second electrode RME2 may be arranged on a same plane.

The light emitting element ED disposed between the bank patterns BP1 and BP2 may emit light toward both ends, and the emitted light may be directed toward the electrodes RME disposed on the bank patterns BP1 and BP2. The electrodes RME may have a structure in which portions thereof disposed on the bank patterns BP1 and BP2 may reflect the light emitted from the light emitting element ED. The first electrode RME1 and the second electrode RME2 may be arranged to cover or overlap at least one side surface or a side surface of the bank patterns BP1 and BP2 and may reflect the light emitted from the light emitting element ED.

The electrodes RME may be in contact with or direct contact with the third conductive layer through the electrode contact holes CTD and CTS at portions overlapping the bank layer BNL between the emission area EMA and the sub-region SA. A first electrode contact hole CTD may be formed in an area in which the bank layer BNL and the first electrode RME1 overlap, and a second electrode contact hole CTS may be formed in an area in which the bank layer BNL and the second electrode RME2 overlap. The first electrode RME1 may be in contact with the first conductive pattern CDP1 through the first electrode contact hole CTD penetrating the via layer VIA and the first passivation layer PV1. The second electrode RME2 may be in contact with the second voltage line VL2 through the second electrode contact hole CTS penetrating the via layer VIA and the first passivation layer PV1. The first electrode RME1 may be electrically connected to the first transistor T1 through the first conductive pattern CDP, so that the first power voltage may be applied to the first electrode RME1, and the second electrode RME2 may be electrically connected to the second voltage line VL2, so that the second power voltage may be applied to the second electrode RME2. However, the disclosure is not limited thereto. In an embodiment, the electrodes RME1 and RME2 may not be electrically connected to the voltage lines VL1 and VL2 of the third conductive layer, respectively, and the connection electrode CNE to be described layer may be connected to or directly connected to the third conductive layer.

The electrodes RME may include a conductive material having high reflectivity. For example, the electrodes RME may contain a metal such as silver (Ag), copper (Cu), or aluminum (Al), or an alloy including aluminum (Al), nickel (Ni), and lanthanum (La), or may have a structure in which a metal layer such as titanium (Ti), molybdenum (Mo), and niobium (Nb) and the alloy may be stacked each other. In an embodiment, the electrodes RME may be formed as a double layer or multiple layers formed by stacking at least one metal layer made of an alloy including aluminum (Al) and titanium (Ti), molybdenum (Mo), and niobium (Nb).

The disclosure is not limited thereto, and each electrode RME may further include a transparent conductive material. For example, each electrode RME may include a material such as ITO, IZO, and ITZO. In an embodiment, each of the electrodes RME may have a structure in which at least one transparent conductive material and at least one metal layer having high reflectivity may be stacked each other, or may be formed as one layer or a layer including them. For example, each electrode RME may have a stacked structure of ITO/Ag/ITO, ITO/Ag/IZO, ITO/Ag/ITZO/IZO, or the like within the spirit and the scope of the disclosure. The electrodes RME may be electrically connected to the light emitting element ED, and may reflect some or a number of the lights emitted from the light emitting element ED in the upward direction of the first substrate SUB.

The first insulating layer PAS1 may be disposed in the entire display area DPA, and may be disposed on the via layer VIA and the electrodes RME. The first insulating layer PAS1 may protect the electrodes RME and insulate electrodes RME different from each other. For example, the first insulating layer PAS1 is disposed to cover or overlap the electrodes RME before the bank layer BNL is formed, so that it is possible to prevent the electrodes RME from being damaged in a process of forming the bank layer BNL. The first insulating layer PAS1 may prevent the light emitting element ED disposed thereon from being damaged by contact or direct contact with other members.

In an embodiment, the first insulating layer PAS1 may have stepped portions such that the top surface thereof is partially depressed between the electrodes RME spaced apart in the second direction DR2. The light emitting element ED may be disposed on the top surface of the first insulating layer PAS1, where the stepped portions are formed, and thus a space may remain between the light emitting element ED and the first insulating layer PAS1.

The bank layer BNL may be disposed on the first insulating layer PAS1. The bank layer BNL may include portions extending in the first direction DR1 and the second direction DR2, and may surround the sub-pixels SPXn. The bank layer BNL may surround and distinguish the emission area EMA and the sub-region SA of each sub-pixel SPXn, and may surround the outermost part of the display area DPA and distinguish the display area DPA and the non-display area NDA. The bank layer BNL is disposed in the entire display area DPA to form a grid pattern, and the regions opened by the bank layer BNL in the display area DPA may be the emission area EMA and the sub-region SA.

The bank layer BNL may have a height similar to those of the bank patterns BP1 and BP2. In an embodiment, the bank layer BNL may have a top surface higher than those of the bank patterns BP1 and BP2, and may have a thickness greater than or equal to those of the bank patterns BP1 and BP2. The bank layer BNL may prevent ink from overflowing to adjacent sub-pixels SPXn in an inkjet printing process during the manufacturing process of the display device 10. The bank layer BNL may contain an organic insulating material such as polyimide, similarly to the bank patterns BP1 and BP2.

The light emitting elements ED may be arranged in the emission area EMA. The light emitting elements ED may be disposed between the bank patterns BP1 and BP2, and may be arranged to be spaced apart from each other in the first direction DR1. In one embodiment, the light emitting elements ED may have a shape extending in one direction or a direction, and both ends thereof may be disposed on different electrodes RME. The length of the light emitting element ED may be greater than the gap between the electrodes RME spaced apart from each other in the second direction DR2. The extension direction of the light emitting elements ED may be substantially perpendicular to the first direction DR1 in which the electrodes RME extend. However, the disclosure is not limited thereto, and the light emitting element ED may extend in the second direction DR2 or in a direction oblique to the second direction DR2.

The light emitting elements ED may be arranged on the first insulating layer PAS1. The light emitting element ED may have a shape extending in one direction or a direction, and may be disposed such that one direction or a direction in which the light emitting element ED extends is parallel to the top surface of the first substrate SUB. As will be described later, the light emitting element ED may include semiconductor layers arranged along one direction or a direction in which the light emitting element ED extends, and the semiconductor layers may be sequentially arranged along the direction parallel to the top surface of the first substrate SUB. However, the disclosure is not limited thereto, and the semiconductor layers may be arranged in the direction perpendicular to the first substrate SUB in case that the light emitting element ED has another structure.

The light emitting elements ED disposed in each sub-pixel SPXn may emit light of different wavelength bands depending on a material constituting the semiconductor layer. However, the disclosure is not limited thereto, and the light emitting elements ED arranged in each sub-pixel SPXn may include the semiconductor layer of the same material or a similar material and emit light of the same color.

The light emitting elements ED may be electrically connected to the electrode RME and the conductive layers below the via layer VIA while being in contact with the connection electrodes CNE (CNE1 and CNE2), and may emit light of a specific or given wavelength band by receiving an electrical signal.

The second insulating layer PAS2 may be disposed on the light emitting elements ED, the first insulating layer PAS1, and the bank layer BNL. The second insulating layer PAS2 may include a pattern portion disposed on the light emitting elements ED while extending in the first direction DR1 between the bank patterns BP1 and BP2. The pattern portion is disposed to partially surround the outer surface of the light emitting element ED, and may not cover or overlap both sides or both ends of the light emitting element ED. The pattern portion may form a linear or island-like pattern in each sub-pixel SPXn in a plan view. The pattern portion of the second insulating layer PAS2 may protect the light emitting element ED and fix the light emitting elements ED during a manufacturing process of the display device 10. Further, the second insulating layer PAS2 may be disposed to fill the space between the light emitting element ED and the second insulating layer PAS2 thereunder. Further, a part of the second insulating layer PAS2 may be disposed on the bank layer BNL and in the sub-regions SA.

The connection electrodes CNE (CNE1 and CNE2) may be disposed on the electrodes RME and the bank patterns BP1 and BP2. The connection electrodes CNE may have a shape extending in one direction or a direction and may be spaced apart from each other. Each of the connection electrodes CNE may be in contact with the light emitting element ED, and may be electrically connected to the third conductive layer.

The connection electrodes CNE may include the first connection electrode CNE1 and the second connection electrode CNE2 disposed in each sub-pixel SPXn. The first connection electrode CNE1 may have a shape extending in the first direction DR1 and may be disposed on the first electrode RME1 or the first bank pattern BP1. The first connection electrode CNE1 may partially overlap the first electrode RME1 and may be disposed across the emission area EMA and the sub-region SA over the bank layer BNL. The second connection electrode CNE2 may have a shape extending in the first direction DR1 and may be disposed on the second electrode RME2 or the second bank pattern BP2. The second connection electrode CNE2 may partially overlap the second electrode RME2 and may be disposed across the emission area EMA and the sub-region SA over the bank layer BNL. The first connection electrode CNE1 and the second connection electrode CNE2 may be in contact with the light emitting elements ED, and may be electrically connected to the electrodes RME or the conductive layer thereunder.

For example, the first connection electrode CNE1 and the second connection electrode CNE2 may be disposed on the side surfaces of the second insulating layer PAS2 and may be in contact with the light emitting elements ED. The first connection electrode CNE1 may partially overlap the first electrode RME1 and may be in contact with one ends of the light emitting elements ED. The second connection electrode CNE2 may partially overlap the second electrode RME2 and may be in contact with the other ends of the light emitting elements ED. The connection electrodes CNE are disposed across the emission area EMA and the sub-region SA. The connection electrodes CNE may be in contact with the light emitting elements ED at portions disposed in the emission area EMA, and may be electrically connected to the third conductive layer at portions disposed in the sub-region SA.

In accordance with one embodiment, in the display device 10, the connection electrodes CNE may be in contact with the electrode RME through the contact portions CT1 and CT2 disposed in the sub-region SA. The first connection electrode CNE1 may be in contact with the first electrode RME1 through the first contact portion CT1 penetrating the first insulating layer PAS1, the second insulating layer PAS2, and the third insulating layer PAS3 in the sub-region SA. The second connection electrode CNE2 may be in contact with the second electrode RME2 through the second contact portion CT2 penetrating the first insulating layer PAS1 and the second insulating layer PAS2 in the sub-region SA. Each of the connection electrodes CNE may be electrically connected to the third conductive layer through each of the electrodes RME. The first connection electrode CNE1 may be electrically connected to the first transistor T1, so that the first power voltage may be applied to the first connection electrode CNE1. The second connection electrode CNE2 may be electrically connected to the second voltage line VL2, so that the second power voltage may be applied to the second connection electrode CNE2. Each connection electrode CNE may be in contact the light emitting element ED in the emission area EMA to transmit the power voltage to the light emitting element ED.

However, the disclosure is not limited thereto. In an embodiment, the connection electrodes CNE may be in direct contact with the third conductive layer, and may be electrically connected to the third conductive layer through patterns other than the electrode RME.

The connection electrodes CNE may include a conductive material. For example, they may include ITO, IZO, ITZO, aluminum (Al), or the like within the spirit and the scope of the disclosure. For example, the connection electrode CNE may contain a transparent conductive material, and the light emitted from the light emitting element ED may be emitted through the connection electrode CNE.

The third insulating layer PAS3 is disposed on the second connection electrode CNE2 and the second insulating layer PAS2. The third insulating layer PAS3 may be disposed on the entire second insulating layer PAS2 to cover or overlap the second connection electrode CNE2, and the first connection electrode CNE1 may be disposed on the third insulating layer PAS3. The third insulating layer PAS3 may be disposed on the entire via layer VIA except the region where the second connection electrode CNE2 is disposed. The third insulating layer PAS3 may insulate the first connection electrode CNE1 and the second connection electrode CNE2 to prevent direct contact therebetween.

Although not illustrated in the drawings, another insulating layer may be further disposed on the third insulating layer PAS3 and the first connection electrode CNE1. The insulating layer may function to protect the members disposed on the first substrate SUB against the external environment.

Each of the first insulating layer PAS1, the second insulating layer PAS2 and the third insulating layer PAS3 described above may include an inorganic insulating material or an organic insulating material. For example, each of the first insulating layer PAS1, the second insulating layer PAS2, and the third insulating layer PAS3 may contain an inorganic insulating material, or the first insulating layer PAS1 and the third insulating layer PAS3 may contain an inorganic insulating material and the second insulating layer PAS2 may contain an organic insulating material. Each or at least one of the first insulating layer PAS1, the second insulating layer PAS2, and the third insulating layer PAS3 may have a structure in which insulating layers may be stacked each other alternately or repeatedly. In an embodiment, each of the first insulating layer PAS1, the second insulating layer PAS2, and the third insulating layer PAS3 may be made of any one of silicon oxide (SiOx), silicon nitride (SiNx), and silicon oxynitride (SiOxNy). The first insulating layer PAS1, the second insulating layer PAS2, and the third insulating layer PAS3 may be made of the same material or a similar material or different materials. For example, some or a number of them may be made of the same material or a similar material, and some or a number of them may be made of different materials.

Figure 7:
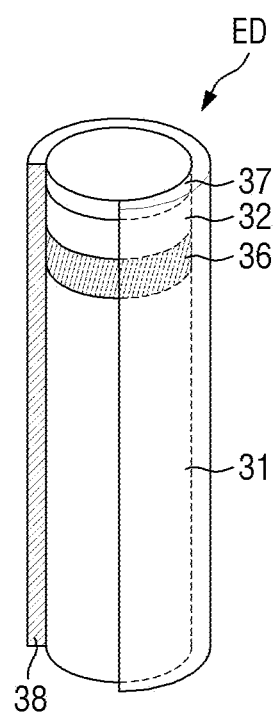
FIG. 7 is a schematic view of a light emitting element according to one embodiment.

FIG. 7 is a schematic view of a light emitting element according to one embodiment.

Referring to FIG. 7, the light emitting element ED may be a light emitting diode. By way of example, the light emitting element ED may be an inorganic light emitting diode that has a nanometer or micrometer size, and is made of an inorganic material. The light emitting element ED may be aligned between two electrodes having polarity in case that an electric field is formed in a specific or given direction between two electrodes facing each other.

The light emitting element ED according to one embodiment may have a shape elongated in one direction or a direction. The light emitting element ED may have a shape of a cylinder, a rod, a wire, a tube, or the like within the spirit and the scope of the disclosure. However, the shape of the light emitting element ED is not limited thereto, and the light emitting element ED may have a polygonal prism shape such as a regular cube, a rectangular parallelepiped and a hexagonal prism, or may have various shapes such as a shape elongated in one direction or a direction and having an outer surface partially inclined.

The light emitting element ED may include a semiconductor layer doped with any conductivity type (for example, p-type or n-type) dopant. The semiconductor layer may emit light of a specific or given wavelength band by receiving an electrical signal applied from an external power source. The light emitting element ED may include a first semiconductor layer 31, a second semiconductor layer 32, a light emitting layer 36, an electrode layer 37 and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of AlGaInN, GaN, AlGaN, InGaN, AlN and InN doped with an n-type dopant. The n-type dopant doped into the first semiconductor layer 31 may be Si, Ge, Sn, or the like within the spirit and the scope of the disclosure.

The second semiconductor layer 32 is disposed on the first semiconductor layer 31 with the light emitting layer 36 therebetween. The second semiconductor layer 32 may be a p-type semiconductor, and the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of AlGaInN, GaN, AlGaN, InGaN, AlN and InN doped with a p-type dopant. The p-type dopant doped into the second semiconductor layer 32 may be Mg, Zn, Ca, Ba, or the like within the spirit and the scope of the disclosure.

Although it is illustrated in the drawing that the first semiconductor layer 31 and the second semiconductor layer 32 are one layer or a layer, the disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer.

The light emitting layer 36 is disposed between the first semiconductor layer 31 and the second semiconductor layer 32. The light emitting layer 36 may include a material having a single or multiple quantum well structure. In case that the light emitting layer 36 may include a material having a multiple quantum well structure, quantum layers and well layers may be alternately stacked each other. The light emitting layer 36 may emit light by coupling of electron-hole pairs according to an electrical signal applied through the first semiconductor layer 31 and the second semiconductor layer 32. The light emitting layer 36 may include a material such as AlGaN or AlGaInN. In case that the light emitting layer 36 has a structure in which quantum layers and well layers may be alternately stacked each other in a multiple quantum well structure, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy may be alternately stacked each other, and may include other group III to V semiconductor materials according to the wavelength band of the emitted light. The light emitted by the light emitting layer 36 is not limited to light of a blue wavelength band, but the active layer 36 may also emit light of a red or green wavelength band in some cases.

The electrode layer 37 may be an ohmic connection electrode. However, the disclosure is not limited thereto, and it may be a Schottky connection electrode. The light emitting element ED may include at least one electrode layer 37. The light emitting element ED may include one or more electrode layers 37, but the disclosure is not limited thereto, and the electrode layer 37 may be omitted.

In the display device 10, in case that the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating film 38 may be arranged to surround the outer surfaces of the semiconductor layers and electrode layers described above. For example, the insulating film 38 may be disposed to surround at least the outer surface of the light emitting layer 36, and may be formed to expose both ends of the light emitting element ED in the longitudinal direction. Further, in cross-sectional view, the insulating film 38 may have a top surface, which is rounded in a region adjacent to at least one end of the light emitting element ED.

The insulating film 38 may include a material having insulating properties, such as silicon oxide (SiOx), silicon nitride (SiNx), silicon oxynitride (SiOxNy), aluminum nitride (AlNx), and aluminum oxide AlOx). It is illustrated in the drawing that the insulating film 38 is formed as a single layer, but the disclosure is not limited thereto. In an embodiment, the insulating film 38 may be formed in a multilayer structure having layers stacked therein.

The insulating film 38 may serve to protect the semiconductor layers and the electrode layer of the light emitting element ED. The insulating film 38 may prevent an electrical short circuit that is likely to occur at the light emitting layer 36 in case that an electrode to which an electrical signal is transmitted is in contact with or direct contact with the light emitting element ED. The insulating film 38 may prevent a decrease in luminous efficiency of the light emitting element ED.

Further, the insulating film 38 may have an outer surface which is surface-treated. The light emitting elements ED may be aligned in such a way of spraying the ink in which the light emitting elements ED are dispersed on the electrodes. Here, the surface of the insulating film 38 may be treated in a hydrophobic or hydrophilic manner in order to keep the light emitting elements ED in a dispersed state without aggregation with other light emitting elements ED adjacent in the ink.

Figure 8A:
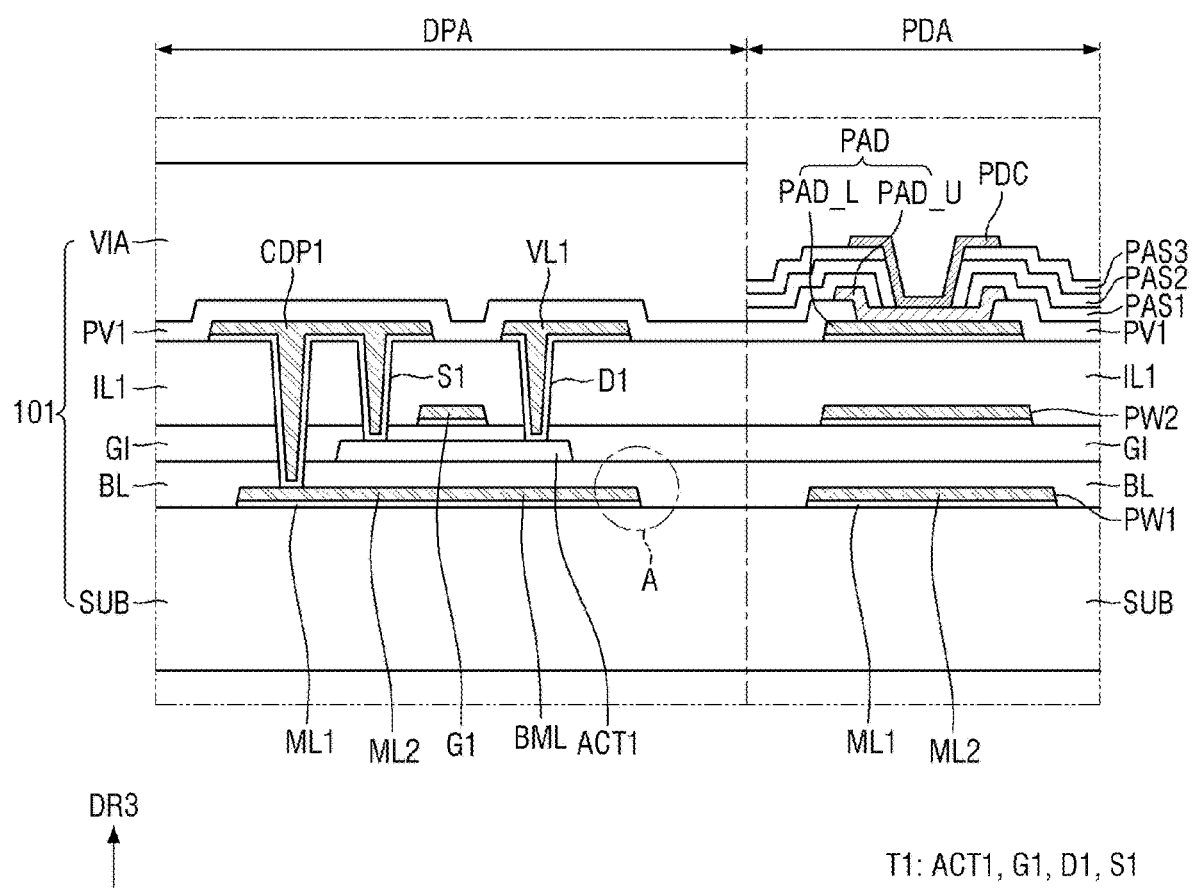
FIG. 8A is a schematic cross-sectional view illustrating a pad electrode and a first transistor formed by wires and a conductive pattern disposed on the wiring substrate of a display device according to one embodiment.
Figure 8B:
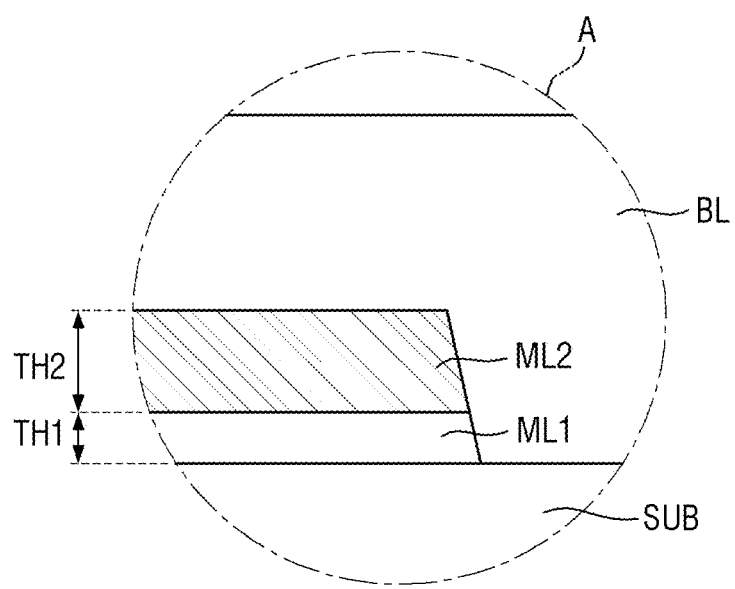
FIG. 8B is an enlarged view of area A of FIG. 8A.

FIG. 8A is a schematic cross-sectional view illustrating a pad electrode and a first transistor formed by wires and a conductive pattern disposed on the wiring substrate of a display device according to one embodiment. FIG. 8B is an enlarged view of area A of FIG. 8A. FIGS. 8A and 8B illustrate the first transistor T1 disposed in the display area DPA of the display device 10, and pad wires PW1 and PW2 and a pad electrode PAD disposed in the pad area PDA thereof. FIGS. 8A and 8B illustrate in detail the structure of the conductive layers included in the wiring substrate 101.

Referring to FIGS. 8A and 8B in conjunction with FIGS. 5 and 6, the display device 10 according to one embodiment may include the pad wires PW1 and PW2, and the pad electrode PAD, and a pad electrode capping layer PDC disposed in the pad area PDA. The pad wires PW1 and PW2 and a pad electrode base layer PAD_L of the pad electrode PAD may be formed as first to third conductive layers of the wiring substrate 101.

For example, the pad wires PW1 and PW2 may include a first pad wire PW1 and a second pad wire PW2. The first pad wire PW1 may be disposed on or directly disposed on the first substrate SUB, and the second pad wire PW2 may be disposed on or directly disposed on the first gate insulating layer GI. The first pad wire PW1 may be formed as the first conductive layer in the pad area PDA of the wiring substrate

101, and the second pad wire PW2 may be formed as the second conductive layer in the pad area PDA of the wiring substrate 101.

The first pad wire PW1 may be formed simultaneously with the lower metal layer BML in the display area DPA and may contain the same material or a similar material. The second pad wire PW2 may be formed simultaneously with the gate electrodes G1 and G2 in the display area DPA and may contain the same material or a similar material. Although it is illustrated in the drawing that the first pad wire PW1 and the second pad wire PW2 overlap each other in the thickness direction, the disclosure is not limited thereto. In an embodiment, each of the first pad wire PW1 and the second pad wire PW2 may be electrically connected to any one of the wires of the first to third conductive layers disposed in the display area DPA, and at least one of them may be electrically connected to the pad electrode PAD disposed thereon.

The pad electrode PAD may be disposed in the pad area PDA of the wiring substrate 101, and may be connected to any one of the above-described wire pads WPD. Although not shown in the drawing, the pad electrode PAD may be electrically connected to any one of the wires disposed in the display area DPA, and an electrical signal applied from the wire pad WPD may be transmitted to the wires in the display area DPA through the pad electrode PAD.

The pad electrode PAD may include the pad electrode base layer PAD_L and a pad electrode upper layer PAD_U disposed thereon. The pad electrode base layer PAD_L may be disposed on or directly disposed on the first interlayer insulating layer IL1, and the pad electrode upper layer PAD_U may be disposed on or directly disposed on the first passivation layer PV1. The via layer VIA of the wiring substrate 101 may be disposed in the display area DPA and may not be disposed in the pad area PDA. The pad electrode base layer PAD_L may be formed as the third conductive layer, and may be formed simultaneously with a first conductive pattern CDP1 of the display area DPA and contain the same material or a similar material.

In the pad area PDA, the first passivation layer PV1 may be exposed without the via layer VIA disposed thereon. The pad electrode upper layer PAD_U may be formed simultaneously with the electrode RME of the display area DPA and may contain the same material or a similar material. The first insulating layer PAS1 disposed in the display area DPA may be disposed on or directly disposed on the pad electrode upper layer PAD_U and the first passivation layer PV1, and the second insulating layer PAS2 and the third insulating layer PAS3 may be sequentially disposed thereon.

The pad electrode capping layer PDC may be disposed on the third insulating layer PAS3 in the pad area PDA of the wiring substrate 101. The pad electrode capping layer PDC may be formed simultaneously with any one of the connection electrodes CNE in the display area DPA and may contain the same material or a similar material. The pad electrode capping layer PDC may be in contact with or direct contact with the pad electrode upper layer PAD_U through the contact hole penetrating the first insulating layer PAS1, the second insulating layer PAS2, and the third insulating layer PAS3, and may be electrically connected thereto. The pad electrode capping layer PDC may be disposed on the pad electrode PAD and electrically connected to the pad electrode PAD while protecting the pad electrode PAD. The above-described wire pad WPD may be disposed on the pad electrode capping layer PDC.

In accordance with one embodiment, in the wiring substrate 101 of the display device 10, each of the wires or the conductive patterns of the first to third conductive layers may include metal layers ML1 and ML2. Each of the wires and the conductive patterns formed as the first to third conductive layers of the wiring substrate 101 may have a structure in which the metal layers ML1 and ML2 having different compositions may be sequentially stacked each other.

For example, each of the lower metal layer BML and the first pad wire PW1 of the first conductive layer may include a first metal layer ML1 and a second metal layer ML2 disposed on the first metal layer ML1. Each of the first gate electrode G1 and the second pad wire PW2 of the second conductive layer may also include the first metal layer ML1 and the second metal layer ML2, and each of the first conductive pattern CDP1, the first voltage line VL1, and the pad electrode base layer PAD_L of the third conductive layer may also include the first metal layer ML1 and the second metal layer ML2.

The first metal layer ML1 may be the base layer of the conductive pattern or the wires of the first to third conductive layers. The first metal layer ML1 of each of the conductive layers may be disposed on or directly disposed on the first substrate SUB, the first gate insulating layer GI, or the first interlayer insulating layer IL1. The bottom surface of the first metal layer ML1 may be in contact with the top surfaces of the first substrate SUB, the first gate insulating layer GI, or the first interlayer insulating layer ILL The first metal layer ML1 may contain a material having a high light absorption rate and low light reflectivity. For example, the first metal layer ML1 may be made of titanium (Ti) or copper (Cu), or may be made of an alloy including copper (Cu), or a metal oxide. A detailed description thereof will be given later.

The second metal layer ML2 may be the upper layer of the conductive pattern or the wires of the first to third conductive layers. The second metal layer ML2 of each of the conductive layers may be disposed on or directly disposed on the first metal layer ML1, and the bottom surface of the second metal layer ML2 may be in contact with the top surface of the first metal layer ML1. The second metal layer ML2 may contain a metal material having excellent electrical conductivity due to low resistivity. For example, the second metal layer ML2 may be made of one of copper (Cu), silver (Ag), magnesium (Mg), aluminum (Al), indium (In), niobium (Nb), and boron (B), or may be made of an alloy thereof.

In accordance with one embodiment, the second metal layer ML2 of the conductive layers included in the wiring substrate 101 of the display device 10 may contain copper (Cu) having a grain size of about 155 nm or less and a resistivity of about 5 μΩcm or less.

Each of the conductive layers of the wiring substrate 101 may be formed by depositing metal materials of the first metal layer ML1 and the second metal layer ML2 and patterning them. In an embodiment, each of the conductive layers of the wiring substrate 101 may be patterned by an etching process using a non-per-aqueous etchant composition. In case that the conductive layers of the wiring substrate 101 are etched by the non-per-aqueous etchant composition, the metal layer of the conductive layer may have a difference in etching rate for the etchant composition between the inside of the grain and the grain boundary. Accordingly, the wires or the conductive patterns of the conductive layer may be patterned along the grain boundary of the material.

Since each of the wires or the conductive patterns of the conductive layers of the wiring substrate 101 according to one embodiment may include the second metal layer ML2 of copper (Cu) and having a grain size of about 155 nm or less, the roughness of the surface etched along the boundary of the grain may be reduced and a smooth surface may be obtained. For example, the wires extending in one direction or a direction among the conductive layers of the wiring substrate 10 may have smooth side surfaces patterned by the etchant composition, so that the straightness of the wire may be improved.

Further, the wires and the conductive patterns included in the conductive layer of the wiring substrate 101 may have inclined side surfaces patterned by the etchant composition, and the side surface of the conductive layer may have a taper angle with respect to the top surface of the layer thereunder. The wires or the conductive patterns of the conductive layer may have smooth etched surfaces due to a small grain size of the second metal layer ML2, and the difference in the taper angle that may be locally generated on the etched side surfaces may be reduced. Accordingly, in the wiring substrate 101, a step coverage defect that may occur in the insulating layer disposed on each of the conductive layers, for example, the buffer layer BL disposed on the first conductive layer, may be reduced. In the wiring substrate 101 according to one embodiment, the wires or the conductive patterns of the conductive layers have improved straightness, a reduced difference in the taper angle of the side surface, and a low resistivity, so that it is possible to prevent a burnt defect and a short circuit that may occur in the wires.

In accordance with one embodiment, a thickness TH1 of the first metal layer ML1 may be smaller than a thickness TH2 of the second metal layer ML2. The first metal layer ML1 and the second metal layer ML2 may contain different materials, and may perform different functions on each conductive layer of the wiring substrate 101 as described above. Since the first metal layer ML1 performs the function of blocking light incident from the outside, the first metal layer ML1 may have a relatively small thickness compared to that of the second metal layer ML2. In an embodiment, in each of the conductive layers of the wiring substrate 101, the first metal layer ML1 may have the thickness TH1 of about 500 Å or less, and the second metal layer ML2 may have the thickness TH2 in a range of about 3000 Å to about 17000 Å, or of about 6000 Å. Since the first metal layer ML1 has the thickness TH1 within the above-described range, the grain growth of the second metal layer ML2 disposed thereon may be minimized. Since the second metal layer ML2 has the thickness TH2 within the above-described range and has a grain size of about 155 nm or less, a smooth surface may be formed. However, the disclosure is not limited thereto.

In the wires or conductive patterns included in the wiring substrate 101, the second metal layer ML2 may contain copper (Cu) and have a grain size of about 155 nm or less by adjusting the material of the first metal layer ML1 or the material of the second metal layer ML2. In accordance with one embodiment, in the wiring substrate 101, the first metal layer ML1 of each of the conductive layers may contain titanium (Ti), and the second metal layer ML2 may be a copper alloy (Cu alloy) containing copper (Cu) as a main component and containing at least one of silver (Ag), magnesium (Mg), aluminum (Al), indium (In), niobium (Nb), or boron (B) as an impurity metal. The second metal layer ML2 may be a copper alloy containing copper (Cu) as a main component and containing one or more impurity metals. For example, the second metal layer ML2 may be an alloy of copper (Cu), aluminum (Al), and magnesium (Mg). The impurity metals contained in the copper alloy may penetrate the grain boundary of copper to suppress the growth of copper grains. Accordingly, the copper alloy containing copper as a main component and further containing a certain content of other impurity metals may have a grain size smaller than that of a pure copper metal.

In an embodiment, the second metal layer ML2 of the conductive layers included in the wiring substrate 101 may be a copper alloy containing copper as a main component and containing the impurity metal at a content of about 5 at % or less. In the embodiment in which the second metal layer ML2 is made of a copper alloy, the impurity metal is contained at a content of about 5 at % or less, so that the grain size may be about 155 nm or less.

Figure 9:
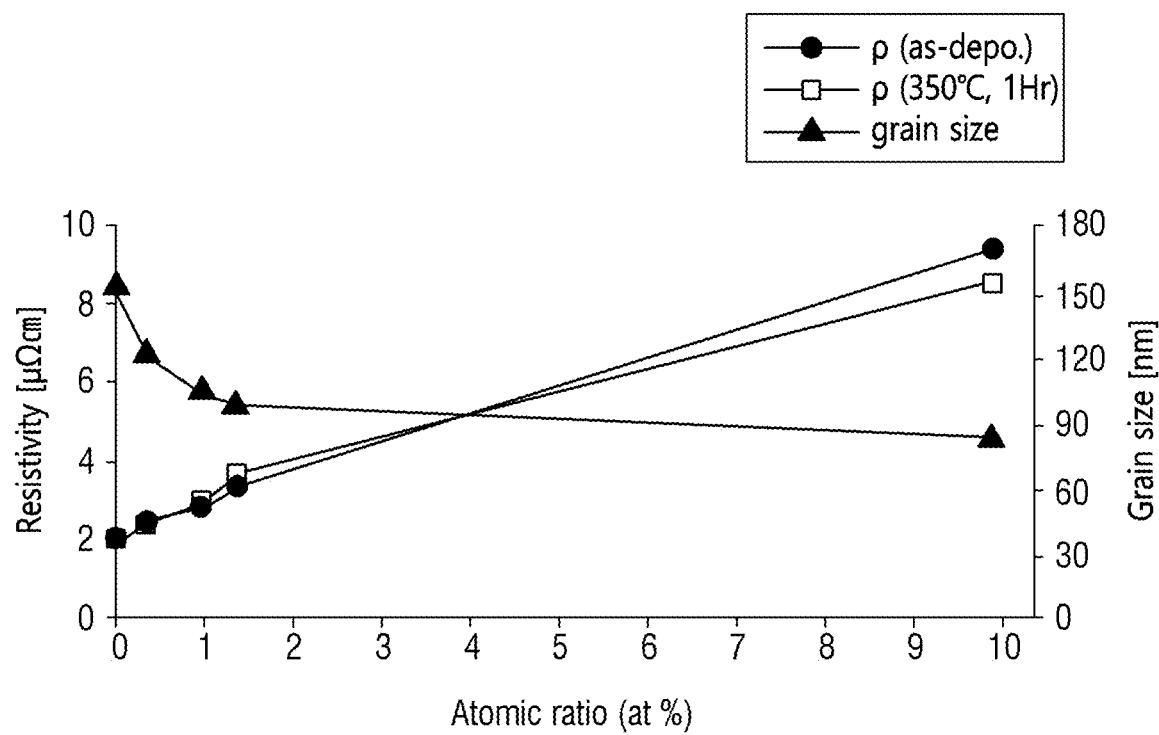
FIG. 9 is a graph illustrating a grain size and a specific resistivity with respect to a content of impurities contained in the second metal layer of conductive layers according to one embodiment.

FIG. 9 is a graph illustrating a grain size and a specific or given resistivity with respect to a content of impurities contained in the second metal layer of conductive layers according to one embodiment. FIG. 9 is a graph showing a grain size (right Y-axis) and a resistivity (left Y-axis) of the second metal layer ML2 in the wire including the first metal layer ML1 containing titanium (Ti) and the second metal layer ML2 made of a copper alloy (Cu Alloy) containing aluminum (Al) and magnesium (Mg). The resistivity ($\rho$(as-depo.) of FIG. 9) immediately after the formation of the wire and the resistivity ($\rho$(about 350° C., 1 Hr) of FIG. 9) after heat treatment performed at 350° C. for 1 hour were measured as the resistivity of the wire.

Referring to FIG. 9, in the wire in which the first metal layer ML1 made of titanium (Ti) and the second metal layer ML2 made of a copper alloy containing aluminum (Al) and magnesium (Mg), the grain size of the copper alloy may vary depending on the content of the impurity metal. As described above, in case that the impurity metal is contained in the copper alloy, the copper grain growth is hindered, so that the grain size of the copper alloy may be reduced. The graph of FIG. 9 shows that in case that the content of the impurity metal in the copper alloy is about 0.1 at %, the grain size of the copper alloy may be about 155 nm, and the grain size of the copper alloy is further reduced as the content of the impurity metal is increased.

However, in accordance with one embodiment, in the embodiment in which the conductive layers of the wiring substrate 101 include the second metal layer ML2 made of a copper alloy, the second metal layer ML2 may not contain, as the impurity metal, calcium (Ca) and cobalt (Co). In case that the copper alloy contains calcium (Ca) or cobalt (Co), it is not possible to control the grain growth of the copper alloy and, thus, the grain size may be further increased compared to in case that another impurity metal is contained. The second metal layer ML2 may be made of a copper alloy containing copper as a main component and further contain other impurity metals capable of controlling the grain growth.

As the content of the impurity metal in the copper alloy increases, the resistivity of the copper alloy may increase. In case that the content of the impurity metal in the copper alloy is about 5 at % or more, the resistivity ($\rho$(as-depo.)) immediately after the formation of the metal layer and the resistivity ($\rho$(about 350° C., 1 Hr)) after the heat treatment performed at about 350° C. for about 1 hour were 5 about $\mu\Omega$cm or more. As the grain size of the second metal layer ML2 containing the copper alloy decreases, the surface of the wire may become smoother and the straightness of the wire may be improved, whereas the resistivity may excessively increase. In the wiring substrate 101 according to one embodiment, the wire or the conductive patterns of the conductive layers may have a grain size of about 155 nm or less and a low resistivity because the first metal layer ML1 contains titanium (Ti) and the second metal layer ML2 contains the copper alloy in which the impurity metal is contained at a content of about 5 at % or less. For example, the impurity metal is contained at a content of about 1 at % in the copper alloy of the second metal layer ML2, and the wires or the conductive patterns of the conductive layers of the wiring substrate 101 may have a grain size of about 155 nm or less and a resistivity of about 5 μΩcm or less. In an embodiment, the wire or the conductive patterns of the conductive layers of the wiring substrate 101 may have a resistivity of about 2.3 μΩcm or less.

Figure 10A:
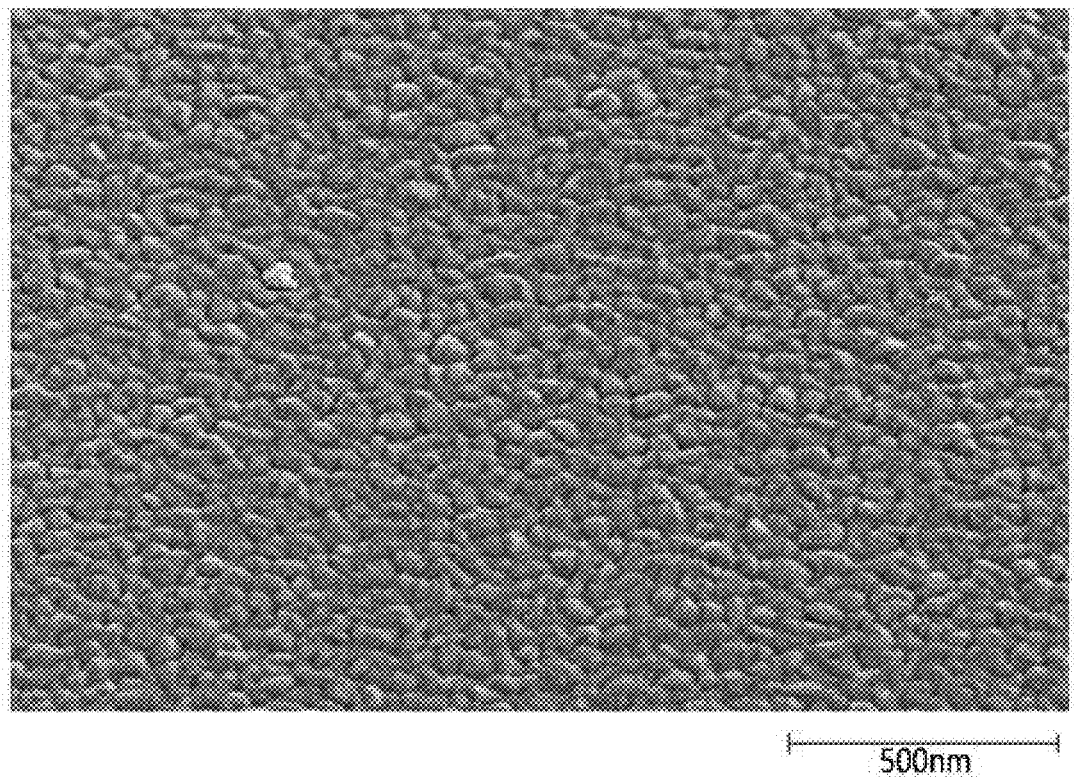
FIGS. 10A and 10B are scanning electron microscope (SEM) images showing a wire or a conductive pattern of a conductive layer according to one embodiment.
Figure 10B:
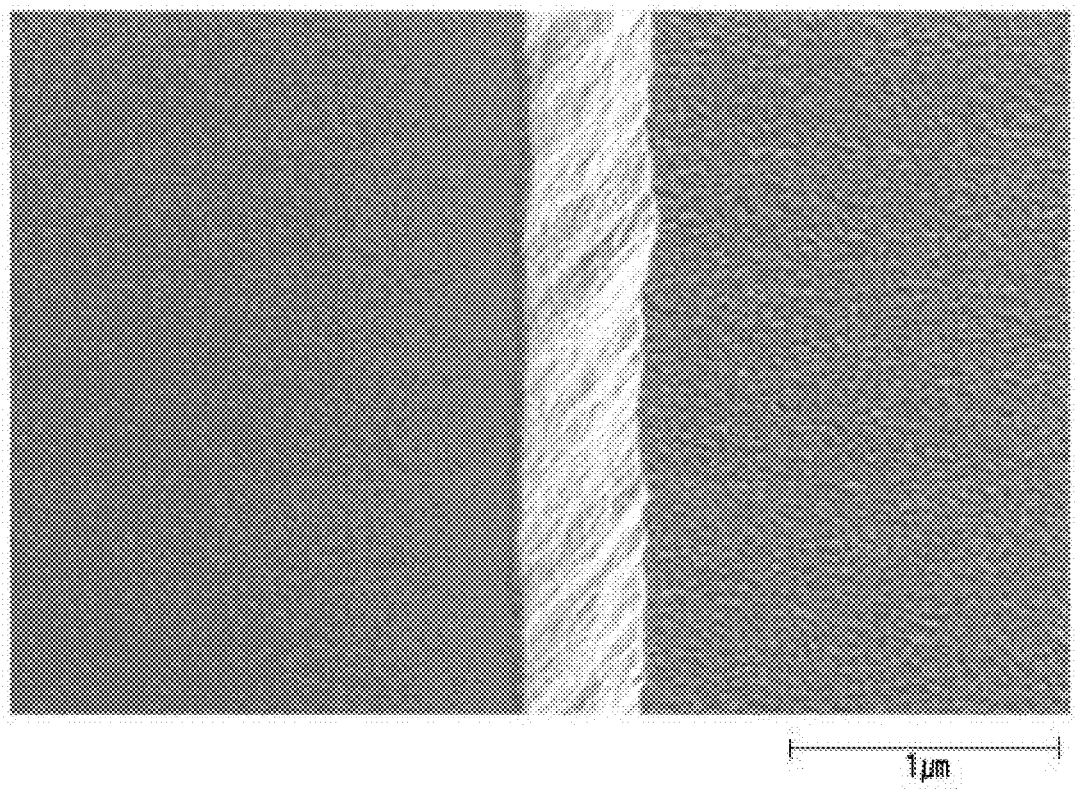

FIGS. 10A and 10B are scanning electron microscope (SEM) images showing a wire or a conductive pattern of a conductive layer according to one embodiment.

FIGS. 10A and 10B illustrate the images of the wire (hereinafter, referred to as Ti/Cu alloy wire) in which the first metal layer ML1 contains titanium (Ti) and the second metal layer ML2 is made of a Cu alloy containing aluminum (Al) and magnesium (Mg) as impurity metals, which are obtained by a scanning electron microscope. FIG. 10A is the image showing grains of the Ti/Cu alloy wire, and FIG. 10B is the image showing, as the inclined side surface profile of the Ti/Cu alloy wire, side surfaces inclined along the extension direction of the wire.

Referring to FIGS. 10A and 10B, the wire (Ti/Cu alloy wire) in which the first metal layer ML1 contains titanium (Ti) and the second metal layer ML2 is made of a Cu alloy containing aluminum (Al) and magnesium (Mg) as impurity metals has a grain size of about 155 nm or less, for example, about 67 nm, and has smooth inclined side surfaces. Since the outer surface of the Ti/Cu alloy wire is flat, the Ti/Cu alloy wire may have a reduced inclination difference depending on positions on the inclined side surface, and the straightness of the side surface extending in one direction or a direction may be improved. In the display device 10 according to one embodiment, the wires or the conductive patterns of the conductive layers of the wiring substrate 101 may have smooth surfaces and improved wire straightness, and a burnt defect and a short circuit that may occur in the wires may be prevented.

Even in case that the second metal layer ML2 of the conductive layers of the wiring substrate 101 is not made of a copper alloy, the grain size of the second metal layer ML2 may be about 155 nm. In accordance with one embodiment, the wires or the conductive patterns of the conductive layers of the wiring substrate 101 may include the second metal layer ML2 made of copper (Cu) and the first metal layer ML1 containing a specific or given material, so that the grain size of the second metal layer ML2 may be about 155 nm.

Figure 11:
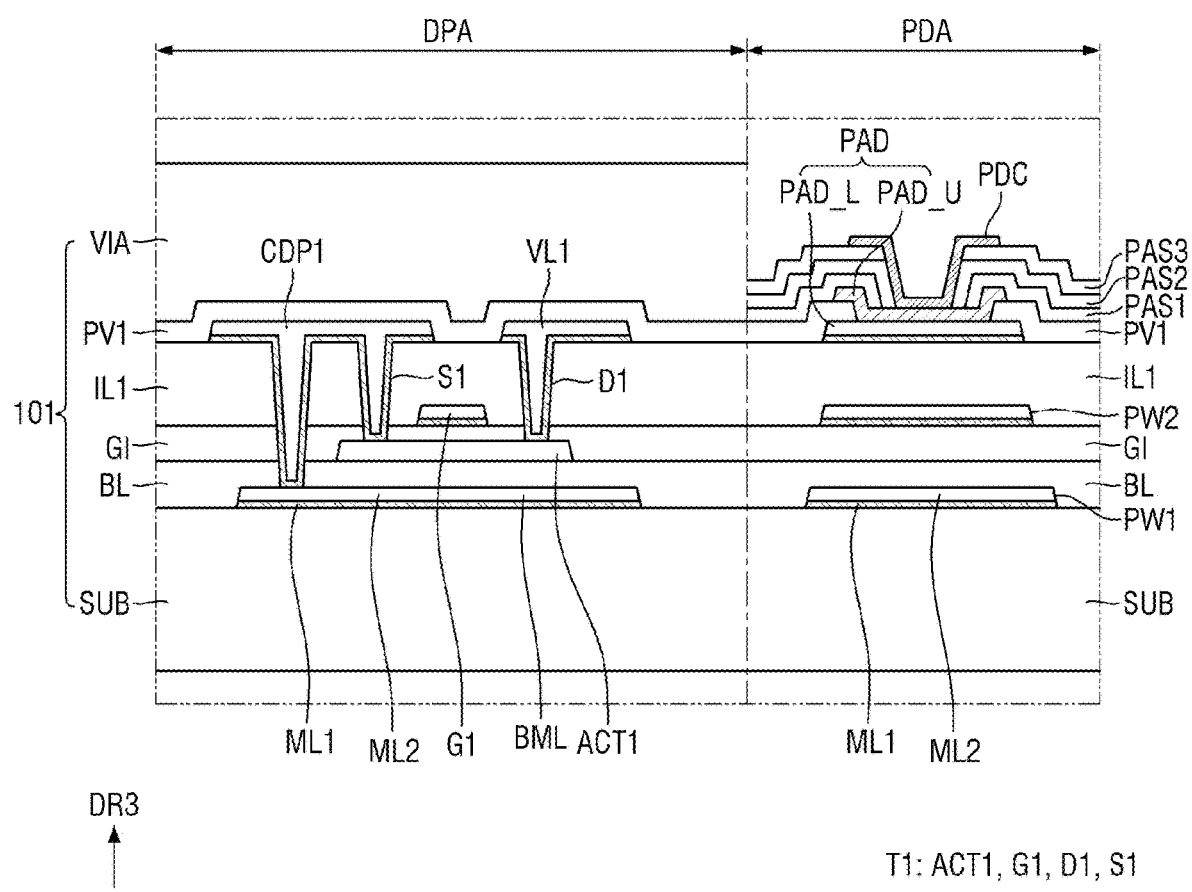
FIG. 11 is a schematic cross-sectional view illustrating a pad electrode and a first transistor formed by wires and conductive pattern disposed on the wiring substrate of a display device according to one embodiment.

FIG. 11 is a schematic cross-sectional view illustrating a pad electrode and a first transistor formed by wires and conductive pattern disposed on the wiring substrate of a display device according to one embodiment. FIG. 11 illustrates the first transistor T1 disposed in the display area DPA of the display device 10, and the pad wires PW1 and PW2 and the pad electrode PAD disposed in the pad area PDA thereof.

Referring to FIG. 11 in conjunction with FIGS. 5 and 6, the first metal layer ML1 of each of the conductive layers of the wiring substrate 101 may contain a copper alloy or a metal oxide, and the second metal layer ML2 thereof may be made of copper (Cu). In the embodiment of FIG. 11, unlike the embodiment of FIGS. 8A and 8B, the second metal layer ML2 may be made of pure copper (Cu), and the first metal layer ML1 may be made of a copper alloy, a titanium alloy, or a metal oxide. In the conductive layers of the wiring substrate 101, the first metal layer ML1 may contain a material having an amorphous structure that is not crystallized or having a random crystal orientation so that the second metal layer ML2 may contain copper (Cu) and have a grain size of about 155 nm or less. In case that the second metal layer ML2 made of copper (Cu) is formed on the first metal layer ML1 having such material characteristics, the growth of copper grains of the second metal layer ML2 is suppressed, and the second metal layer ML2 may contain copper grains having a random grain orientation and a grain size of about 155 nm or less.

In one embodiment, the first metal layer ML1 may be a copper alloy (Cu alloy) containing copper (Cu) as a main component and containing at least one of silver (Ag), magnesium (Mg), aluminum (Al), indium (In), niobium (Nb), or boron (B), or may be a titanium alloy (Ti alloy) containing titanium (Ti) as a main component and containing zinc (Zn). Similarly to the embodiment in which the second metal layer ML2 is made of a copper alloy, in the embodiment in which the first metal layer ML1 is made of a copper alloy, the first metal layer ML1 may contain copper (Cu) as a main component and contain the above-described impurity metals at a content of about 5 at % or less. On the other hand, in the embodiment in which the first metal layer ML1 is made of a titanium alloy, the first metal layer ML1 may contain titanium (Ti) as a main component and contain the above-described impurity metals at a content of about 50 at % or less or at a content of about 40 at %.

In the embodiment in which the first metal layer ML1 contains a copper alloy or a titanium alloy, the first metal layer ML1 has a random crystal orientation, so that copper (Cu) of the second metal layer ML2 may also have a random crystal orientation. For example, the first metal layer ML1 may contain a material having an amorphous structure such as zinc oxide (ZnO), indium-zinc oxide (IZO), or the like within the spirit and the scope of the disclosure. In the embodiment in which the first metal layer ML1 contains a material having an amorphous structure such as a metal oxide, the first metal layer ML1 has an amorphous structure, so that copper (Cu) of the second metal layer ML2 may also have a random crystal orientation.

Figure 12A:
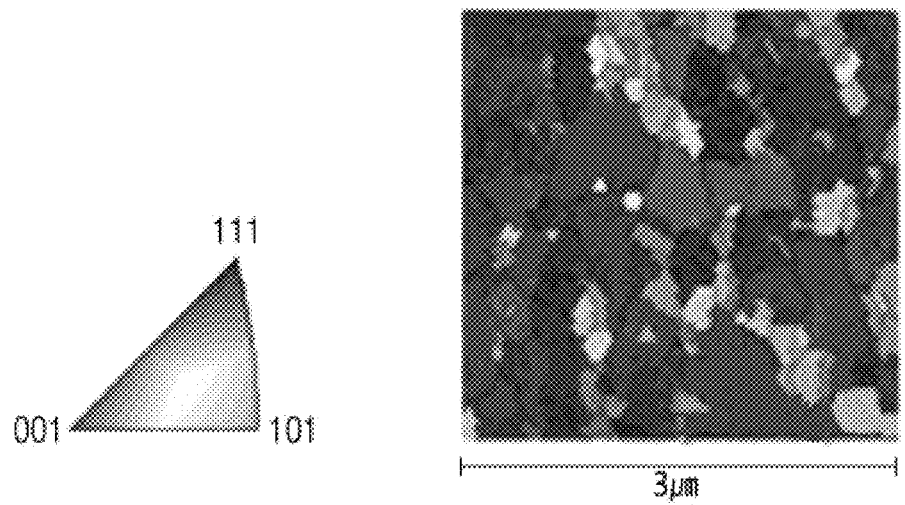
FIGS. 12A to 12C are electron backscatter diffraction (EBSD) pattern images showing the crystal orientation of the second metal layer of conductive layers according to one embodiment.
Figure 12B:
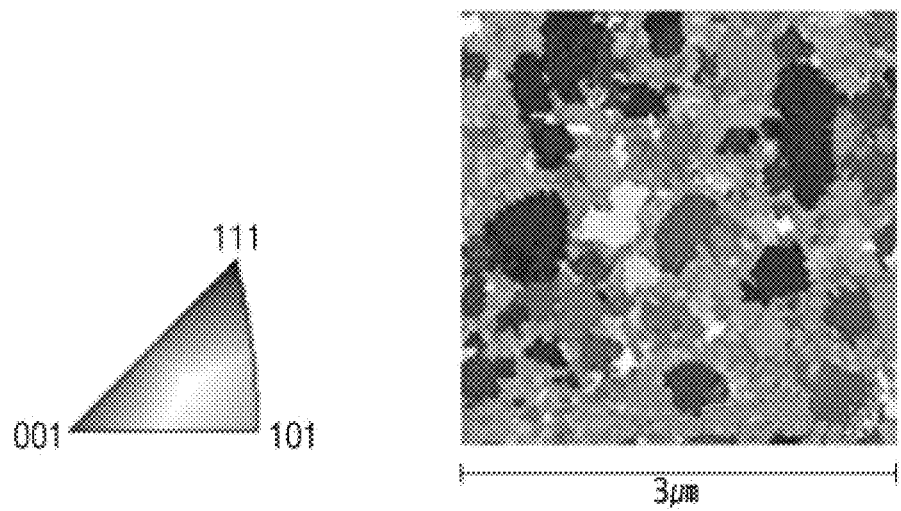
Figure 12C:
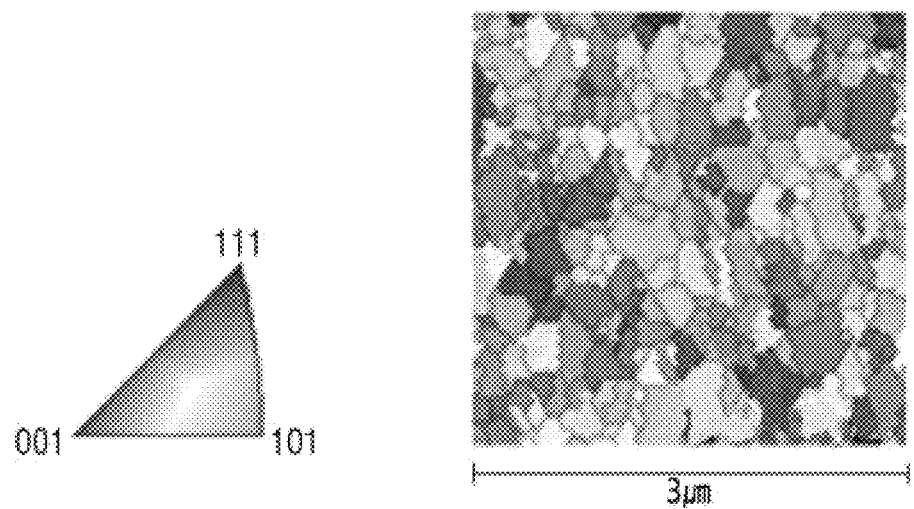

FIGS. 12A to 12C are electron backscatter diffraction (EBSD) pattern images showing the crystal orientation of the second metal layer of conductive layers according to one embodiment. FIGS. 12A to 12C are the images showing the crystal orientation of the second metal layer ML2 in the wire in which the first metal layer ML1 is made of titanium (Ti), indium-zinc oxide (IZO), or a copper alloy (Cu Alloy, CuMgAl) containing or aluminum (Al) and magnesium (Mg), and the second metal layer ML2 is made of copper (Cu).

Referring to FIGS. 12A to 12C, in case that the first metal layer ML1 is made of titanium (Ti) (FIG. 12A), the crystal orientation of copper (Cu) of the second metal layer ML2 is mostly (111) plane, and the grain size is relatively large. On the other hand, in case that the first metal layer ML1 is made of indium-zinc oxide (IZO) or a copper alloy (FIGS. 12B and 12C), copper (Cu) of the second metal layer ML2 has various crystal orientations such as (111) plane, (001) plane, and (101) plane, and copper crystal grains having different crystal orientations are mixed. In the second metal layer ML2, the content of copper (Cu) grains having a specific or given crystal orientation is not dominantly higher than that of copper grains having different crystal orientations, and the copper grains having different crystal orientations may be contained at a similar ratio. Further, copper (Cu) of the second metal layer ML2 has a relatively small crystal grain size.

In case that the first metal layer ML1 is made of a material or an alloy having an amorphous structure, copper (Cu) of the second metal layer ML2 disposed on the first metal layer ML1 may have a random crystal orientation, compared to in case that the first metal layer ML1 is made of titanium (Ti) and the second metal layer ML2 is made of copper (Cu). Copper (Cu) of the second metal layer ML2 may have a small crystal grain size because it has a non-uniform crystal orientation and the crystal grain growth thereof is suppressed. Accordingly, the conductive layers of the wiring substrate 101 may have smooth surfaces and the straightness of the wire may be improved.

Figure 13A:
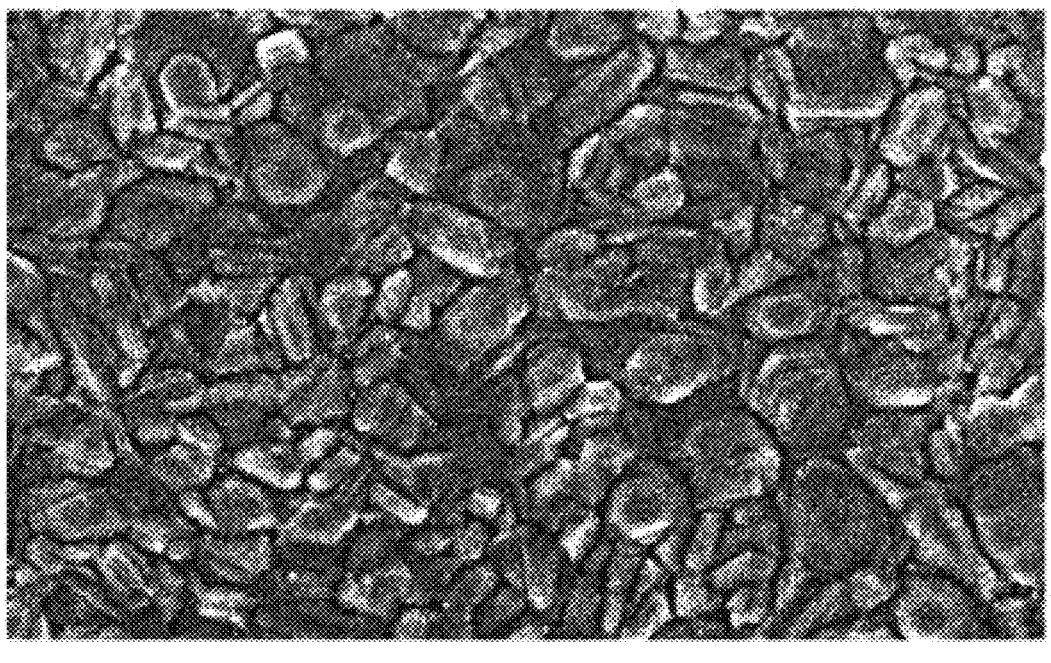
FIGS. 13A and 13B are scanning electron microscope (SEM) images showing wires or conductive patterns of conductive layers according to one embodiment.
Figure 13B:
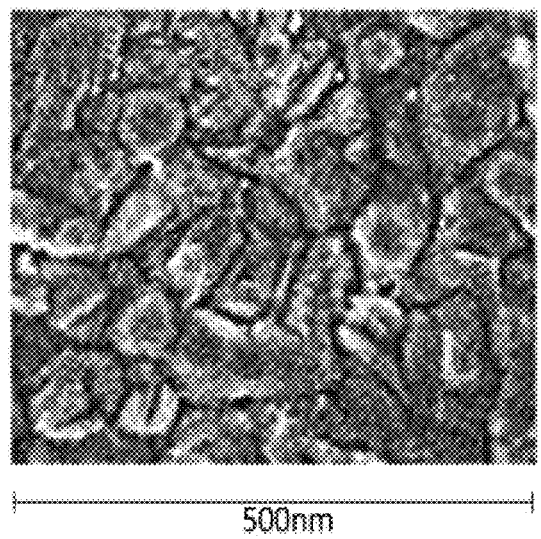

FIGS. 13A and 13B are scanning electron microscope (SEM) images showing wires or conductive patterns of conductive layers according to one embodiment. FIG. 13A is the image of a wire (hereinafter, referred to as ZnO/Cu wire) in which the first metal layer ML1 is made of zinc oxide (ZnO) and the second metal layer ML2 is made of copper (Cu), which is obtained by a scanning electron microscope. FIG. 13B is the image of a wire (hereinafter, referred to as TiZn/Cu wire) in which the first metal layer ML1 is made of titanium-zinc alloy (TiZn) and the second metal layer ML2 is made of copper (Cu), which is obtained by the scanning electron microscope. FIGS. 13A and 13B are the images showing crystal grains of the wires.

FIGS. 13A and 13B, the wire in which the first metal layer ML1 is made of zinc oxide (ZnO) or a titanium-zinc alloy (TiZn) and the second metal layer ML2 is made of copper (Cu) has a grain size of about 155 nm or less. Since the ZnO/Cu wire and the TiZn/Cu wire have small grain sizes, the wires have smooth outer surfaces and the inclination difference depending on positions on the inclined side surfaces is small, so that the straightness of the side surfaces extending in one direction or a direction may be improved. In the display device 10 according to one embodiment, the wires or the conductive patterns of the conductive layers of the wiring substrate 101 may have smooth surfaces and have improved wire straightness, and a burnt defect and a short circuit that may occur in the wires may be prevented.

Hereinafter, other embodiments of the display device 10 will be described with reference to other drawings.

Figure 14:
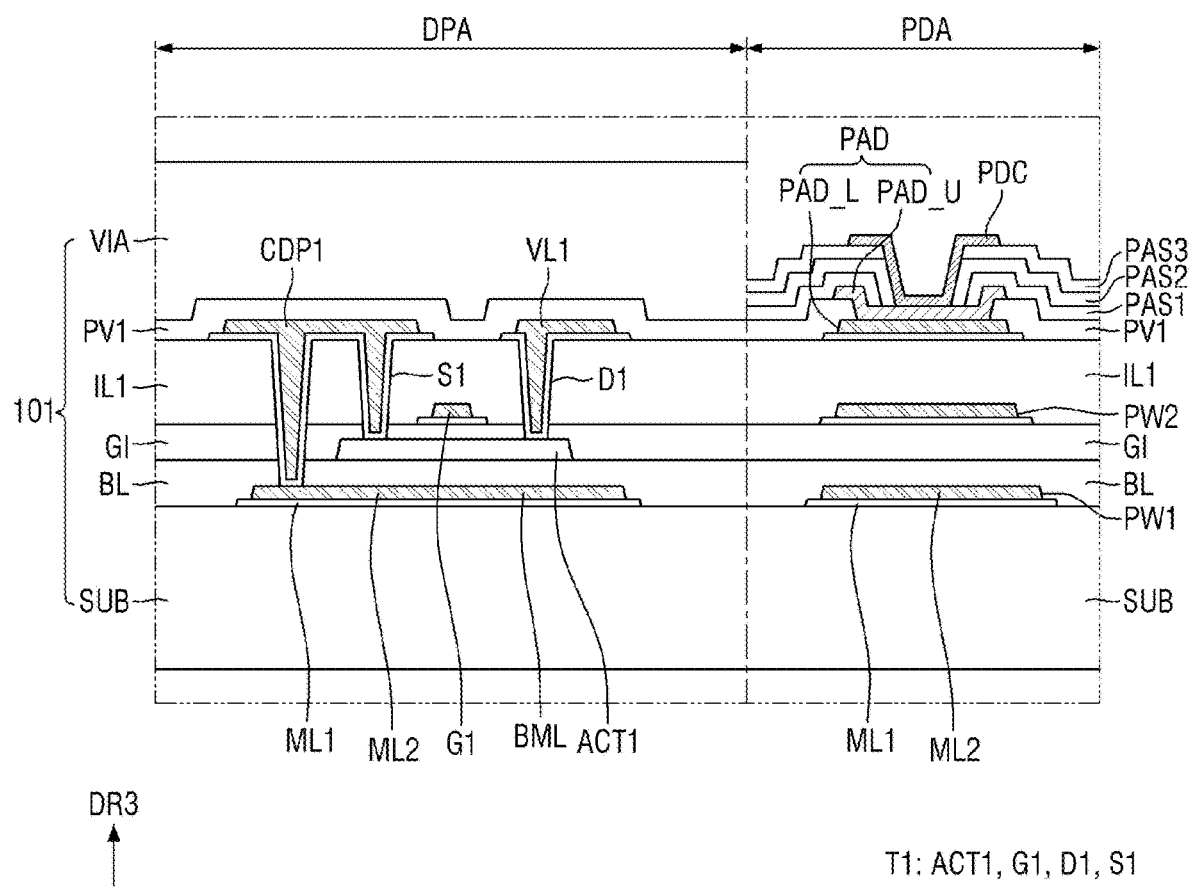
FIGS. 14 and 15 are schematic cross-sectional views illustrating a pad electrode and a first transistor formed by wires and conductive patterns disposed on conductive layers of a display device according to an embodiment.
Figure 15:
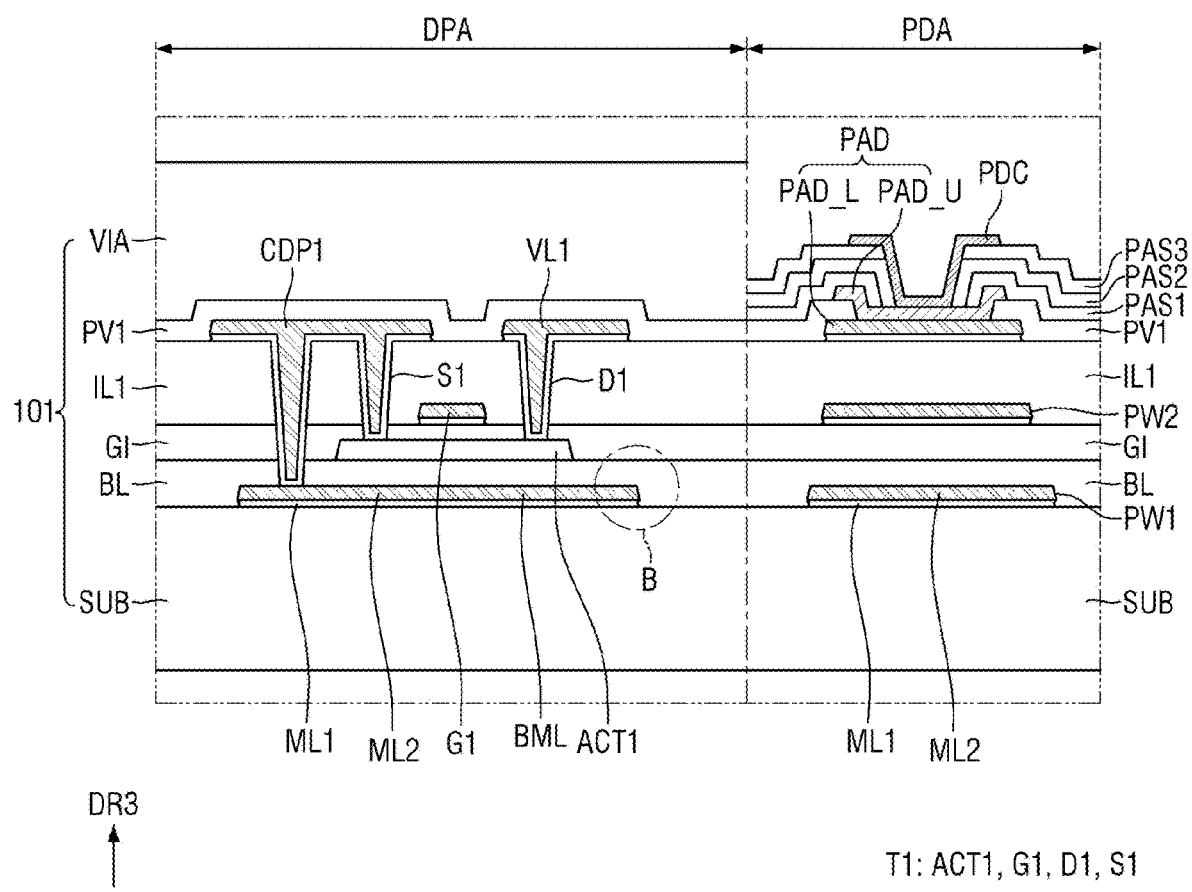
Figure 16:
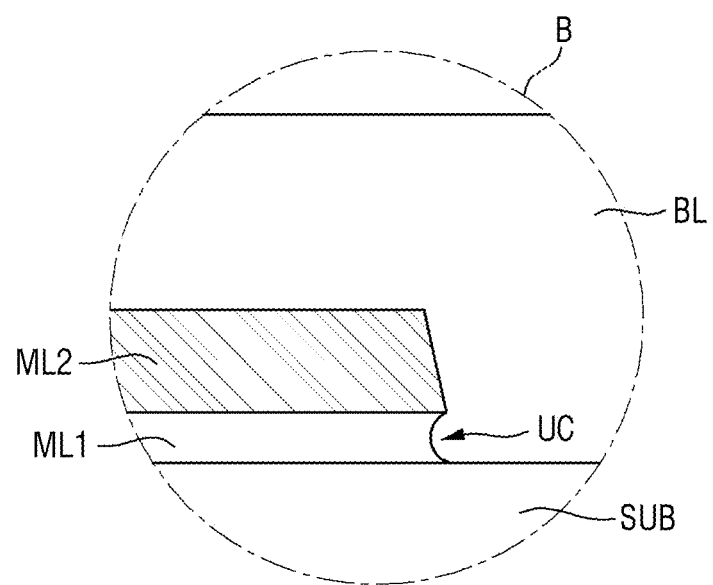
FIG. 16 is an enlarged view of part B of FIG. 15.

FIGS. 14 and 15 are schematic cross-sectional views illustrating a pad electrode and a first transistor formed by wires and conductive patterns disposed on conductive layers of a display device according to an embodiment. FIG. 16 is an enlarged view of part B of FIG. 15.

Referring to FIG. 14, in the wiring substrate 101 and the display device 10 including the same according to one embodiment, each of the first to third conductive layers may include the first metal layer ML1 and the second metal layer ML2, and in the wire or the conductive pattern of the same conductive layer, the width of the first metal layer ML1 may be greater than the width of the second metal layer ML2. For example, both sides of the second metal layer ML2 in the width direction may be inwardly spaced apart from both sides of the first metal layer ML1 in the width direction.

The first metal layer ML1 and the second metal layer ML2 included in the conductive layers of the wiring substrate 101 may be made of different materials. However, in the process of forming the conductive layers, the first metal layer ML1 and the second metal layer ML2 may be simultaneously patterned using a non-per-aqueous etchant composition or may be patterned in separate processes.

In the embodiment of FIGS. 8A, 8B and 11, the first metal layer ML1 and the second metal layer ML2 may be simultaneously patterned so that both side surfaces thereof are parallel to each other. However, the disclosure is not limited thereto, and in case that the first metal layer ML1 and the second metal layer ML2 are separately patterned or etched under different conditions, both side surfaces of the first metal layer ML1 and the second metal layer ML2 may not be parallel to each other.

In the embodiment of FIG. 14, since both side surfaces of the second metal layer ML2 are inwardly spaced apart than both side surfaces of the first metal layer ML1, the width of the second metal layer ML2 may be smaller than the width of the first metal layer ML1 in the wire or the conductive pattern of the same conductive layer. The relative arrangement of the first metal layer ML1 and the second metal layer ML2 may be obtained because the second metal layer ML2 is formed using an etchant composition having an etching rate higher than that of the first metal layer ML1 even though the first metal layer ML1 and the second metal layer ML2 are separately patterned in different processes or simultaneously patterned.

Referring to 15 and 16, in the wiring substrate 101 and the display device 10 including the same according to one embodiment, each of the first to third conductive layers may include the first metal layer ML1 and the second metal layer ML2, and the width of the first metal layer ML1 may be smaller than the width of the second metal layer ML2 in the wire or the conductive pattern of the same conductive layer. For example, the first metal layer ML1 may have an undercut UC formed under or below the second metal layer ML2 at both sides of the first metal layer ML1 in the width direction. As described above, the first metal layer ML1 and the second metal layer ML2 may be patterned simultaneously. Depending on the conditions of the etching process, the first metal layer ML1 may be etched more than the second metal layer ML2. Accordingly, at the edge portion of the wire or the conductive pattern, the undercut UC of the first metal layer ML1 may be formed under or below the second metal layer ML2, and both sides of the first metal layer ML1 in the width direction may be recessed inward from both sides of the second metal layer ML2 in the width direction.

Figure 17:
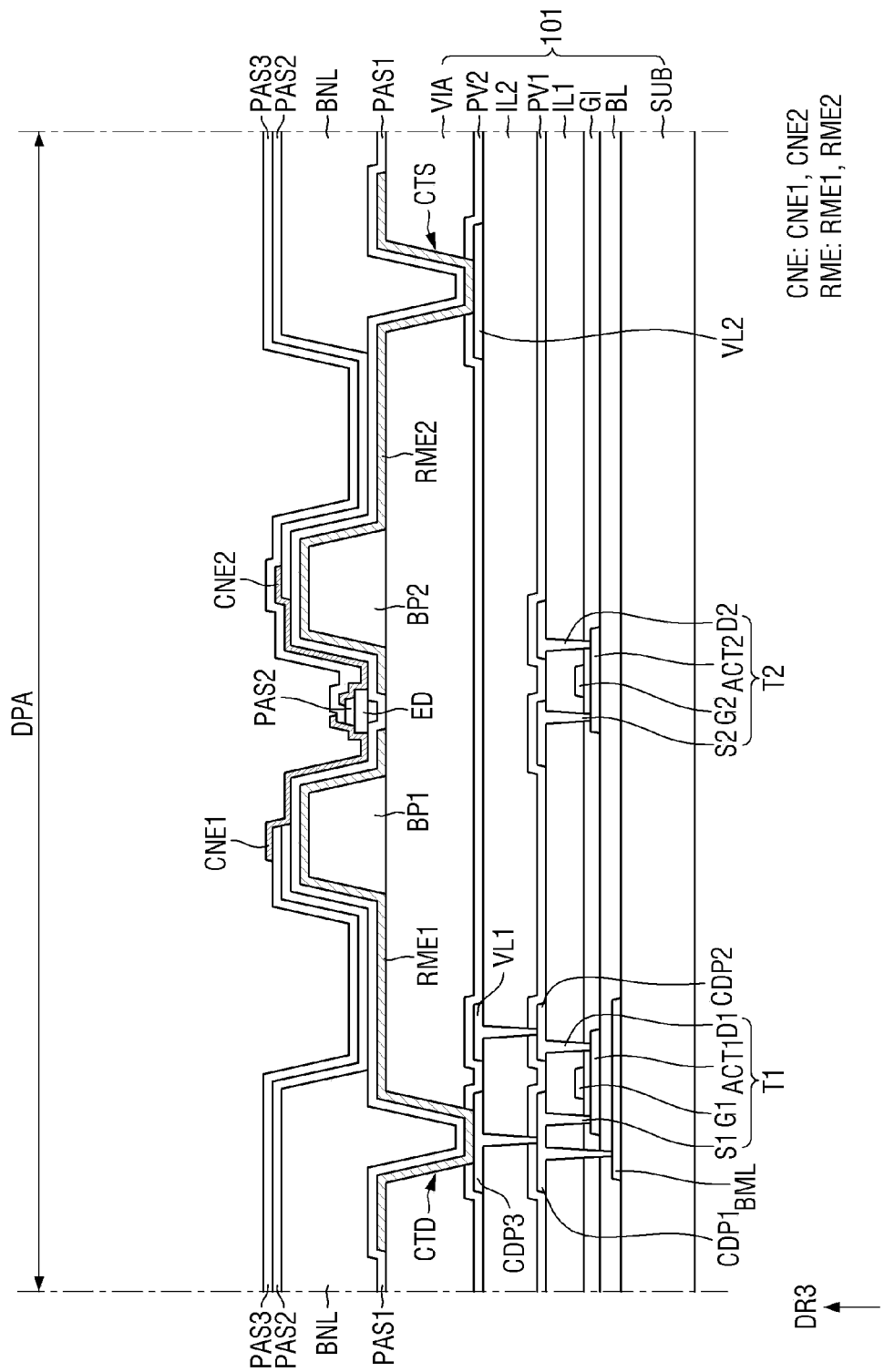
FIG. 17 is a schematic cross-sectional view illustrating a portion of a display device according to an embodiment.

FIG. 17 is a schematic cross-sectional view illustrating a portion of a display device according to an embodiment.

Referring to FIG. 17, in the display device 10 according to one embodiment, the wiring substrate 101 may further include a second interlayer insulating layer IL2 disposed on the third conductive layer, a fourth conductive layer, and a second passivation layer PV2. The embodiment may be different from the embodiment of FIG. 5 in that the wiring substrate 101 included in the display device 10 may include a larger number of conductive layers.

The display device 10 and the wiring substrate 101 of the display device 10 may further include the second interlayer insulating layer IL2 disposed on the first passivation layer PV1, the fourth conductive layer disposed on the second interlayer insulating layer IL2, and the second passivation layer PV2 disposed on the fourth conductive layer. The via layer VIA may be disposed on the second passivation layer PV2, and each of the first electrode contact hole CTD and the second electrode contact hole CTS may penetrate the via layer VIA and the second passivation layer PV2.

The wires or the conductive patterns disposed on the third conductive layer of the embodiment of FIG. 5 may be disposed on different conductive layers. For example, the third conductive layer may include conductive patterns including the first conductive pattern CDP1 and a second conductive pattern CDP2 and serving as source electrodes and drain electrodes of the transistors T1 and T2, and the fourth conductive layer may include the first voltage line VL1, the second voltage line VL2, and a third conductive pattern CDP3.

The first conductive pattern CDP1 and the second conductive pattern CDP2 may serve as the first source electrode S1 and the first drain electrode D1 of the first transistor T1, respectively. Each of the second source electrode S2 and the second drain electrode D2 of the second transistor T2 may also be formed as the third conductive layer.

The fourth conductive layer is disposed above the third conductive layer. The first voltage line VL1 of the fourth conductive layer may be connected to the second conductive pattern CDP2 of the third conductive layer, and the third conductive pattern CDP3 of the fourth conductive layer may be connected to the first conductive pattern CDP1 of the third conductive layer. The first voltage line VL1 may be electrically connected to the first transistor T1 through the second conductive pattern CDP2, and the first electrode RME1 may be electrically connected to the first transistor T1 through the third conductive pattern CDP3. The second electrode RME2 may be connected to or directly connected to the second voltage line VL2 of the fourth conductive layer.

Each of the third conductive layer and the fourth conductive layer may include the first metal layer ML1 and the second metal layer ML2 described with reference to FIGS. 8A, 8B and 11. Each of the wires or the conductive patterns of the third conductive layer and the fourth conductive layer may include the metal layers ML1 and ML2 made of different materials and may have smooth surfaces and improved straightness.

The second interlayer insulating layer IL2 may be disposed between the third conductive layer and the fourth conductive layer. The second interlayer insulating layer IL2 may be disposed on the first passivation layer PV1 covering or overlapping the third conductive layer, and the fourth conductive layer may be disposed on or directly disposed on the second interlayer insulating layer IL2. Similarly to the first interlayer insulating layer IL1, the second interlayer insulating layer IL2 may function as an insulating layer between the third conductive layer and the fourth conductive layer and may protect the third conductive layer.

The second passivation layer PV2 is disposed on the fourth conductive layer. The second passivation layer PV2 may function as an insulating layer between the fourth conductive layer and other layers and may protect the fourth conductive layer.

Figure 18:
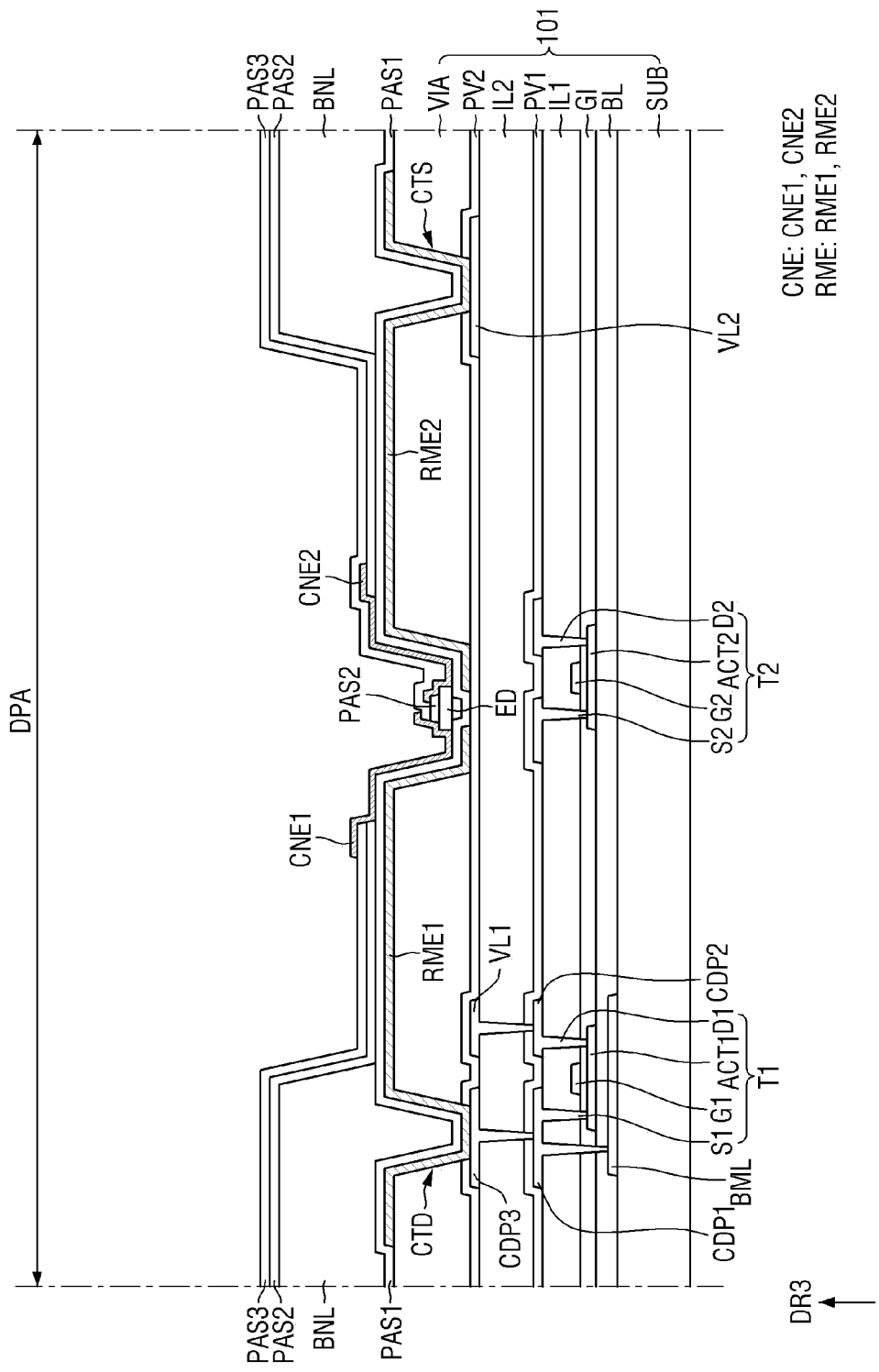
FIG. 18 is a schematic cross-sectional view illustrating a portion of a display device according to an embodiment.

FIG. 18 is a schematic cross-sectional view illustrating a portion of a display device according to an embodiment.

Referring to FIG. 18, in the display device 10 according to one embodiment, the bank patterns BP1 and BP2 disposed on the via layer VIA may be omitted, and the via layer VIA may have trenches in which the light emitting elements ED are disposed. The electrodes RME1 and RME2 and the first insulating layer PAS1 may be disposed in the trenches of the via layer VIA, and the light emitting elements ED may also be disposed on the first insulating layer PAS1 in the trenches. The trenches of the via layer VIA may form inclined sidewalls instead of the bank patterns BP1 and BP2, and the electrodes RME1 and RME2 may be disposed on the inclined sidewalls of the trenches so that the lights emitted from the light emitting element ED may be emitted in the upward direction.

The trenches formed in the via layer VIA may penetrate the via layer VIA, similarly to the electrode contact holes CTD and CTS. The trenches of the via layer VIA may expose the top surface of the second passivation layer PV2 under or below the via layer VIA, and the electrodes RME1 and RME2 and the first insulating layer PAS1 may be partially disposed on or disposed directly on the second passivation layer PV2.

The embodiment of FIG. 18 may be different from the embodiment of FIG. 17 in that the bank patterns BP1 and BP2 are omitted and the via layer VIA has the trenches in which the light emitting elements ED are disposed instead of the bank patterns BP1 and BP2. The other descriptions are the same as the above description.

Figure 19:
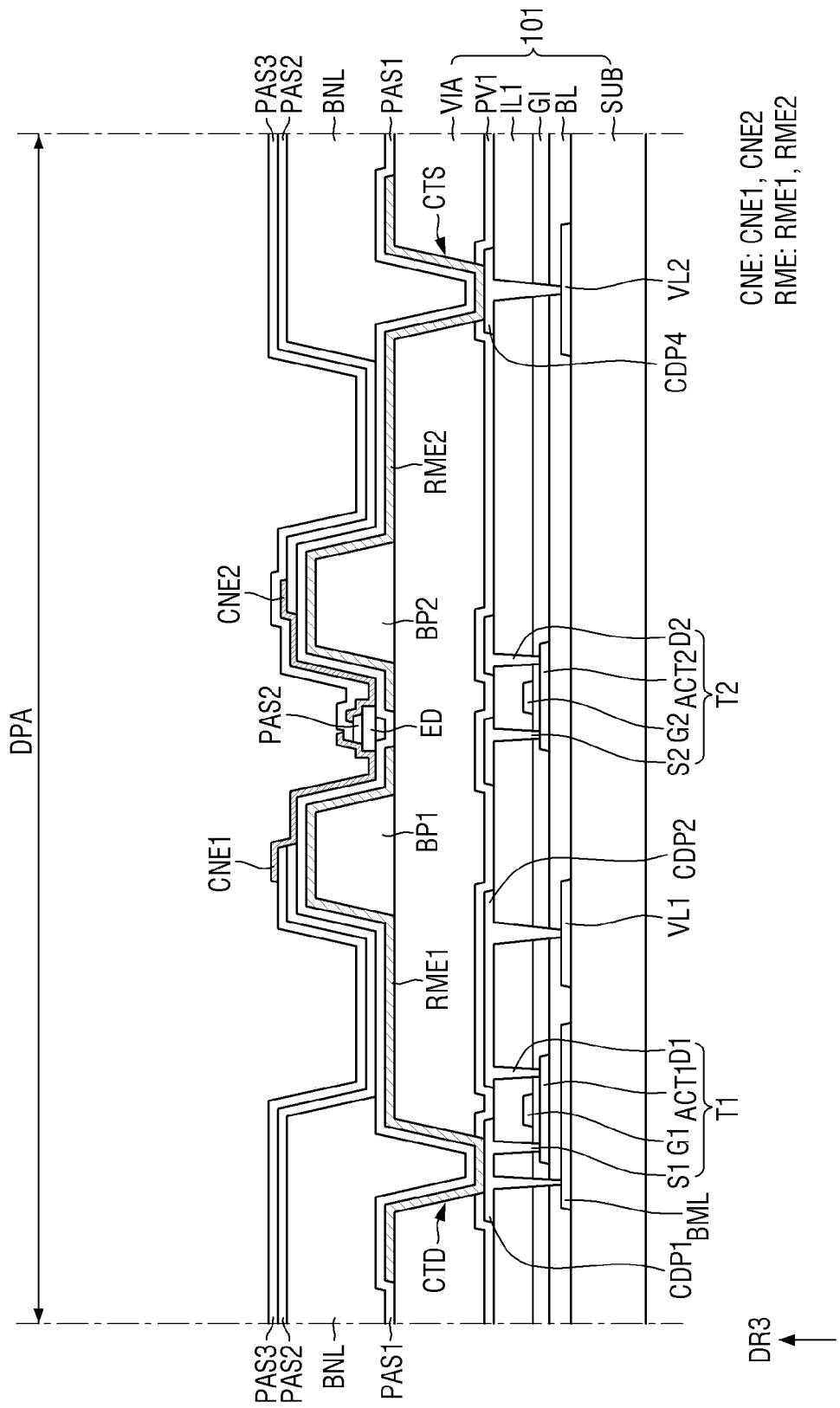
FIG. 19 is a schematic cross-sectional view illustrating a portion of a display device according to an embodiment.

FIG. 19 is a schematic cross-sectional view illustrating a portion of a display device according to an embodiment.

Referring to FIG. 19, in the display device 10 according to one embodiment, each of the first voltage line VL1 and the second voltage line VL2 may be formed as the first conductive layer, and the third conductive layer may further include the second conductive pattern CDP2 and the fourth conductive pattern CDP4. The embodiment may be different from the embodiment of FIG. 5 in that the first voltage line VL1 and the second voltage line VL2 are formed as the first conductive layer, not as the third conductive layer, and the second conductive pattern CDP2 and the fourth conductive pattern CDP4 electrically connecting them to the first transistor T1 or the second electrode RME2 are further included.

Each of the first voltage line VL1 and the second voltage line VL2 may be formed as the first conductive layer, and may include the first metal layer ML1 and the second metal layer ML2 as described above. Detailed descriptions thereof are the same as the above description with reference to FIGS. 5, 8A, 8B and 11.

The third conductive layer may include the second conductive pattern CDP2 connected to the first voltage line VL1. The second conductive pattern CDP2 may serve as the first drain electrode D1 of the first transistor T1 and may be connected to or directly connected to the first voltage line VL1. The first voltage line VL1 may be electrically connected to the first transistor T1 through the second conductive pattern CDP2. Further, the third conductive layer may include the fourth conductive pattern CDP4 connected to the second voltage line VL2. The fourth conductive pattern CDP4 may be connected to each of the second electrode RME2 and the second voltage line VL2, and the second electrode RME2 may be electrically connected to the second voltage line VL2 through the fourth conductive pattern CDP4.

Each of the second conductive pattern CDP2 and the fourth conductive pattern CDP4 may also include the first metal layer ML1 and the second metal layer ML2. Detailed descriptions thereof are the same as the above description with reference to FIGS. 5, 8A, 8B and 11.

Figure 20:
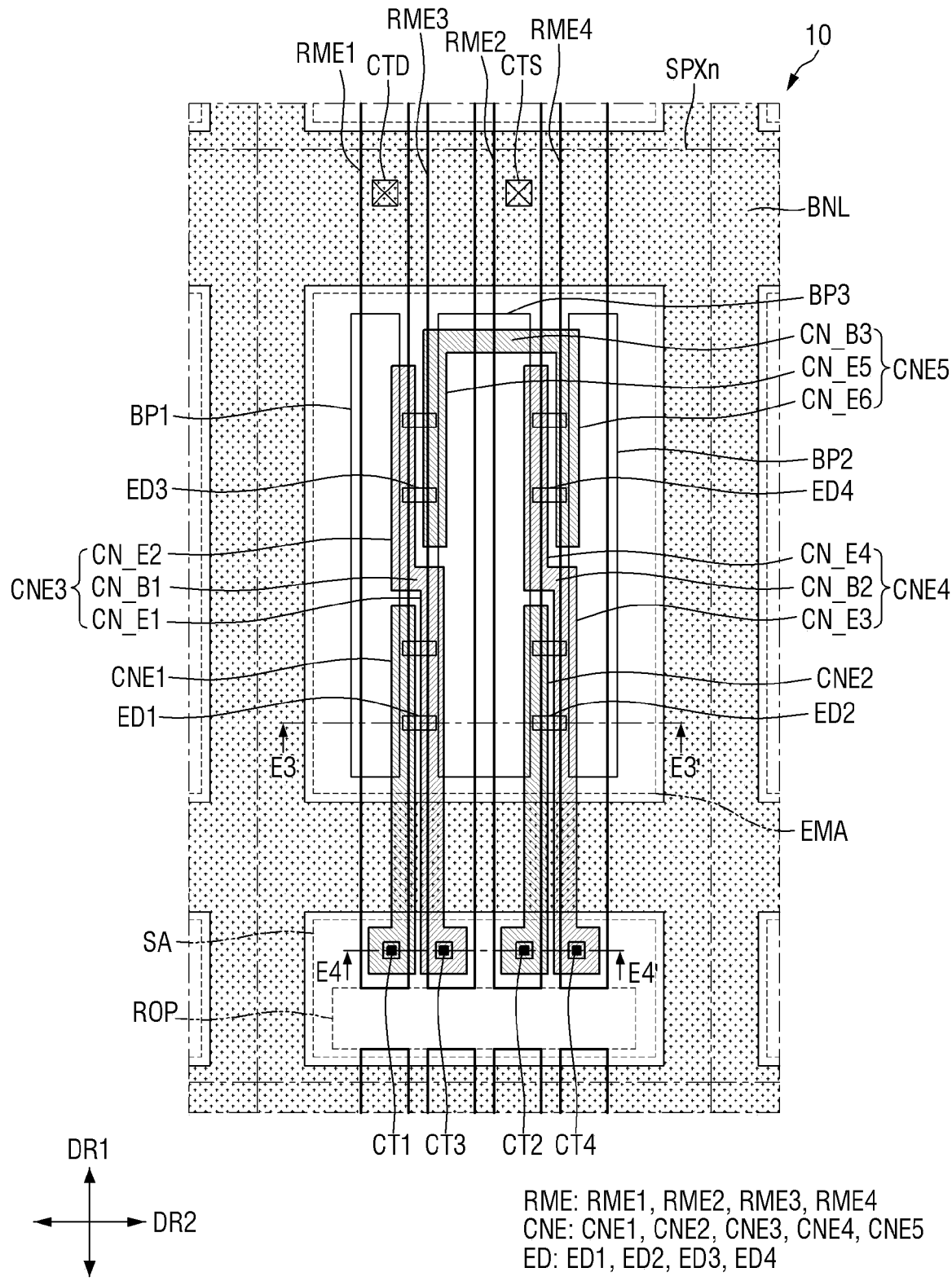
FIG. 20 is a schematic plan view illustrating a sub-pixel of a display device according to an embodiment.
Figure 21:
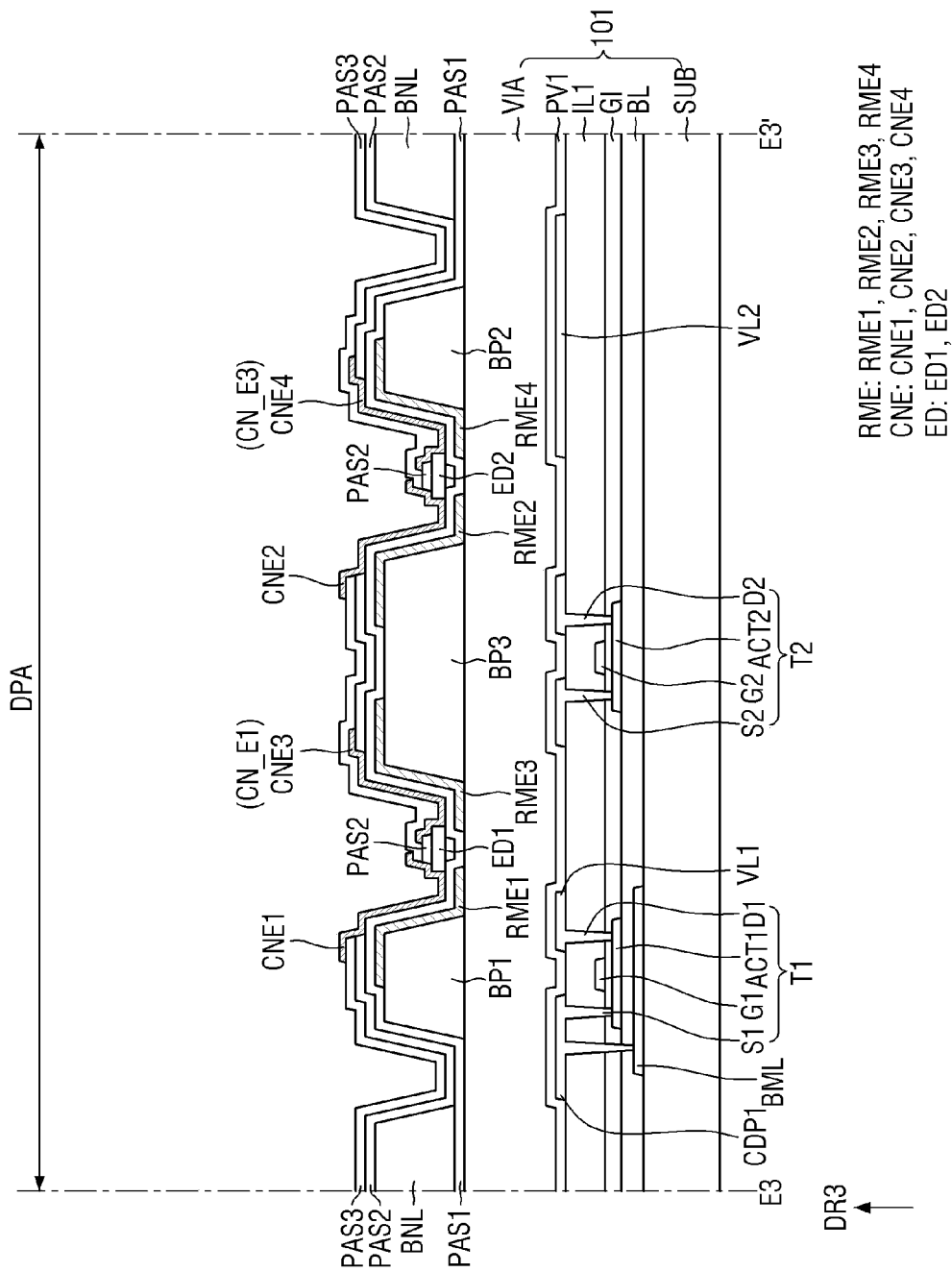
FIG. 21 is a schematic cross-sectional view taken along line E3-E3' in FIG. 20.
Figure 22:
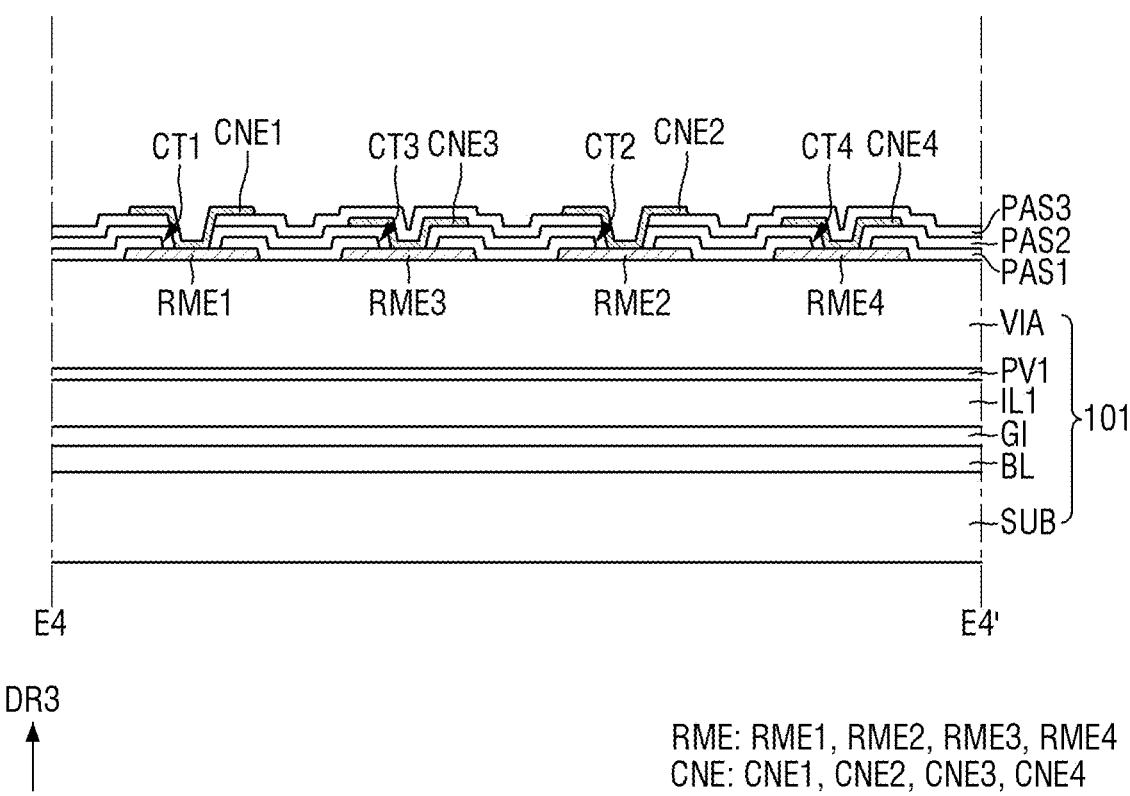
FIG. 22 is a schematic cross-sectional view taken along line E4-E4' in FIG. 20.

FIG. 20 is a schematic plan view illustrating a sub-pixel of a display device according to an embodiment. FIG. 21 is a schematic cross-sectional view taken along line E3-E3' in FIG. 20. FIG. 22 is a schematic cross-sectional view taken along line E4-E4' in FIG. 20. FIG. 20 illustrates a planar arrangement of electrodes RME (RME1, RME2, RME3, and RME4), bank patterns BP1, BP2, and BP3, the bank layer BNL, the light emitting elements ED, connection electrodes CNE (CNE1, CNE2, CNE3, CNE4, and CNE5) disposed in one pixel PX of the display device 10. FIG. 21 illustrates a cross section across both ends of the light emitting elements ED (ED1, ED2, ED3, and ED4) disposed on different electrodes RME, and FIG. 22 illustrates a cross section across contact portions CT1, CT2, CT3, and CT4.

Referring to FIGS. 20 to 22, the display device 10 according to one embodiment may include a larger number of electrodes RME (RME1, RME2, RME3, and RME4), a larger number of bank patterns BP1, BP2, and BP3, a larger number of light emitting elements ED (ED1, ED2, ED3, and ED4), and a larger number of connection electrodes CNE (CNE1, CNE2, CNE3, CNE4, and CNE5). The display device 10 according to the embodiment may be different from the embodiment of FIG. 4 in that a larger number of electrodes and a larger number of light emitting elements are included in each sub-pixel SPXn. In the following description, redundant description will be omitted while focusing on differences.

The bank patterns BP1, BP2, and BP3 may further include a third bank pattern BP3 disposed between the first bank pattern BP1 and the second bank pattern BP2. The first bank pattern BP1 may be located on the left side with respect to the center of the emission area EMA, the second bank pattern BP2 may be located on the right side with respect to the center of the emission area EMA, and the third bank pattern BP3 may be located at the center of the emission area EMA. The width of the third bank pattern BP3 measured in the second direction DR2 may be greater than those of the first bank pattern BP1 and the second bank pattern BP2 measured in the second direction DR2. The gap between the bank patterns BP1, BP2, and BP3 in the second direction DR2 may be greater than the gap between the electrodes RME. The first bank pattern BP1 may be disposed to partially overlap the first electrode RME1, and the second bank pattern BP2 may be disposed to partially overlap the fourth electrode RME4. The third bank pattern BP3 may be disposed to partially overlap the second electrode RME2 and the third electrode RME3. At least parts of the electrodes RME may be arranged without overlapping the bank patterns BP1, BP2, and BP3.

The electrodes RME arranged for each sub-pixel SPXn may further include a third electrode RME3 and a fourth electrode RME4 in addition to a first electrode RME1 and a second electrode RME2.

The third electrode RME3 may be disposed between the first electrode RME1 and the second electrode RME2, and the fourth electrode RME4 may be spaced apart from the third electrode RME3 in the second direction DR2 with the second electrode RME2 interposed therebetween. The electrodes RME may be sequentially arranged in the order of the first electrode RME1, the third electrode RME3, the second electrode RME2, and the fourth electrode RME4 from the left side to the right side of the sub-pixel SPXn. The electrodes RME may face and be spaced apart from each other in the second direction DR2. The electrodes RME may be spaced apart from the electrodes RME of another sub-pixel SPXn adjacent in the first direction DR1 at the separation portion ROP of the sub-region SA.

Among the electrodes RME, the first electrode RME1 and the second electrode RME2 may be in contact with the first conductive pattern CDP1 and the second voltage line VL2 disposed thereunder through the electrode contact holes CTD and CTS disposed under or below the bank layer BNL, respectively, unlike the third electrode RME3 and the fourth electrode RME4.

The first insulating layer PAS1 may be disposed in a structure similar to that in the above-described embodiments. The first insulating layer PAS1 may be disposed in the entire display area DPA, and may cover or overlap the electrodes RME and the bank patterns BP1, BP2, and BP3.

The light emitting elements ED may be arranged between the bank patterns BP1, BP2, and BP3 or on different electrodes RME. Some or a number of the light emitting elements ED may be arranged between the first bank pattern BP1 and the third bank pattern BP3, and some or a number of other light emitting elements ED may be arranged between the third bank pattern BP3 and the second bank pattern BP2. In accordance with one embodiment, the light emitting element ED may include a first light emitting element ED1 and a third light emitting element ED3 arranged between the first bank pattern BP1 and the third bank pattern BP3, and a second light emitting element ED2 and a fourth light emitting element ED4 arranged between the third bank pattern BP3 and the second bank pattern BP2. The first light emitting element ED1 and the third light emitting element ED3 may be disposed on the first electrode RME1 and the third electrode RME3, respectively, and the second light emitting element ED2 and the fourth light emitting element ED4 may be disposed on the second electrode RME2 and the fourth electrode RME4, respectively. The first light emitting element ED1 and the second light emitting element ED2 may be arranged adjacent to the lower side of the emission area EMA of the corresponding sub-pixel SPXn or adjacent to the sub-region SA, and the third light emitting element ED3 and the fourth light emitting element ED4 may be arranged adjacent to the upper side of the emission area EMA of the corresponding sub-pixel SPXn.

However, the light emitting elements ED may not be classified according to the arrangement position in the emission area EMA, but may be classified according to a connection relationship with the connection electrode CNE, which will be described later. Both ends of each light emitting element ED may be in contact with different connection electrodes CNE according to an arrangement method of the connection electrodes CNE. The light emitting elements ED may be classified into different types of light emitting elements ED according to the type of the connection electrode CNE in contact therewith.

The connection electrodes CNE may further include, in addition to the first connection electrode CNE1 disposed on the first electrode RME1, the second connection electrode CNE2 disposed on the second electrode RME2, a third connection electrode CNE3, a fourth connection electrode CNE4, and a fifth connection electrode CNE5 arranged or disposed across the electrodes RME.

Unlike the embodiment of FIGS. 4 to 6, each of the first connection electrode CNE1 and the second connection electrode CNE2 may have a relatively short length extending in the first direction DR1. The first connection electrode CNE1 and the second connection electrode CNE2 may be arranged on the lower side with respect to the center of the emission area EMA. The first connection electrode CNE1 and the second connection electrode CNE2 may be disposed across the emission area EMA and the sub-region SA of the corresponding sub-pixel SPXn, and may be in contact with or direct contact with the electrode RME through the contact portions CT1 and CT2 formed in the sub-region SA, respectively. The first connection electrode CNE1 may be in contact with or direct contact with the first electrode RME1 through the first contact portion CT1 penetrating the first insulating layer PAS1, the second insulating layer PAS2, and the third insulating layer PAS3 in the sub-region SA, and the second connection electrode CNE2 may be in contact with or direct contact with the second electrode RME2 through the second contact portion CT2 penetrating the first insulating layer PAS1, the second insulating layer PAS2, and the third insulating layer PAS3 in the sub-region SA.

The third connection electrode CNE3 may include a first extension portion CN_E1 disposed on the third electrode RME3, a second extension portion CN_E2 disposed on the first electrode RME1, and a first connection portion CN_B1 that connects the first extension portion CN_E1 to the second extension portion CN_E2. The first extension portion CN_E1 may be spaced apart from the first connection electrode CNE1 in the second direction DR2, and the second extension portion CN_E2 may be spaced apart from the first connection electrode CNE1 in the first direction DR1. The first extension portion CN_E1 may be disposed on the lower side of the emission area EMA of the corresponding sub-pixel SPXn, and the second extension portion CN_E2 may be disposed on the upper side of the emission area EMA. The first extension portion CN_E1 and the second extension portion CN_E2 may be disposed in the emission area EMA. The first connection portion CN_B1 may be disposed across the first electrode RME1 and the third electrode RME3 at the central portion of the emission area EMA. The third connection electrode CNE3 may have a shape substantially extending in the first direction DR1, and may have a shape that is bent in the second direction DR2 and extends in the first direction DR1 again.

The fourth connection electrode CNE4 may include a third extension portion CN_E3 disposed on the fourth electrode RME4, a fourth extension portion CN_E4 disposed on the second electrode RME2, and a second connection portion CN_B2 that connects the third extension portion CN_E3 to the fourth extension portion CN_E4. The third extension portion CN_E3 may face and be spaced apart from the second connection electrode CNE2 in the second direction DR2, and the fourth extension portion CN_E4 may be spaced apart from the second connection electrode CNE2 in the first direction DR1. The third extension portion CN_E3 may be disposed on the lower side of the emission area EMA of the corresponding sub-pixel SPXn, and the fourth extension portion CN_E4 may be disposed on the upper side of the emission area EMA. The third extension portion CN_E3 and the fourth extension portion CN_E4 may be disposed in the emission area EMA. The second connection portion CN_B2 may be disposed across the second electrode RME2 and the fourth electrode RME4 while being adjacent to the center of the emission area EMA. The fourth connection electrode CNE4 may have a shape substantially extending in the first direction DR1, and may have a shape that is bent in the second direction DR2 and extends in the first direction DR1 again.

The fifth connection electrode CNE5 may include a fifth extension portion CN_E5 disposed on the third electrode RME3, a sixth extension portion CN_E6 disposed on the fourth electrode RME4, and a third connection portion CN_B3 that connects the fifth extension portion CN_E5 to the sixth extension portion CN_E6. The fifth extension portion CN_E5 may face and be spaced apart from the second extension portion CN_E2 of the third connection electrode CNE3 in the second direction DR2, and the sixth extension portion CN_E6 may face and be spaced apart from the fourth extension portion CN_E4 of the fourth connection electrode CNE4 in the second direction DR2. Each of the fifth extension portion CN_E5 and the sixth extension portion CN_E6 may be arranged on the upper side of the emission area EMA, and the third connection portion CN_B3 may be disposed across the third electrode RME3, the second electrode RME2, and the fourth electrode RME4. The fifth connection electrode CNE5 may be disposed to surround the fourth extension portion CN_E4 of the fourth connection electrode CNE4 in a plan view.

The third connection electrode CNE3 may be in contact with or direct contact with the third electrode RME3 through the third contact portion CT3 penetrating the first insulating layer PAS1 and the second insulating layer PAS2 in the sub-region SA, and the fourth connection electrode CNE4 may be in contact with or direct contact with the fourth electrode RME4 through the fourth contact portion CT4 penetrating the first insulating layer PAS1 and the second insulating layer PAS2 in the sub-region SA.

However, the disclosure is not limited thereto. In an embodiment, in the display device 10, some or a number of the connection electrodes CNE may be connected to or directly connected to the third conductive layer. For example, the first connection electrode CNE1 and the second connection electrode CNE2 that are first type connection electrodes may be connected to or directly connected to the third conductive layer and may not be electrically connected to the electrode RME. A second type connection electrode and a third type connection electrode may not be electrically connected to the electrode RME, and may be connected only to the light emitting elements ED.

The first connection electrode CNE1 and the second connection electrode CNE2 may be the first type connection electrodes connected to the electrodes RME1 and RME2 connected to or directly connected to the third conductive layer, respectively. The third connection electrode CNE3 and the fourth connection electrode CNE4 may be the second type connection electrodes connected to the electrodes RME3 and RME4 that are not connected to the third conductive layer. The fifth connection electrode CNE5 may be the third type connection electrode that is not connected to the electrode RME. The fifth connection electrode CNE5 may be in contact with the light emitting elements ED without being connected to the electrode RME and may constitute an electrical connection circuit of the light emitting elements ED together with other connection electrodes CNE.

The third connection electrode CNE3 and the fourth connection electrode CNE4 that are the second type connection electrodes may be connection electrodes in which electrode extension portions extending in the first direction DR1 are not parallel to each other in the second direction DR2. The fifth connection electrode CNE5 that is the third type connection electrode may be the connection electrode in which electrode extension portions extending in the first direction DR1 are parallel to each other in the second direction DR2. The third connection electrode CNE3 and the fourth connection electrode CNE4 may have a shape that is bent while extending in the first direction DR1, and the fifth connection electrode CNE5 may have a shape surrounding a part of another connection electrode.

The light emitting elements ED may be classified into different light emitting elements ED depending on the connection electrodes CNE to be in contact with both ends of the light emitting elements ED to correspond to the arrangement structure of the connection electrodes CNE. The first light emitting element ED1 and the second light emitting element ED2 may have first ends in contact with the first type connection electrodes and second ends in contact with the second type connection electrodes. The first light emitting element ED1 may be in contact with the first connection electrode CNE1 and the third connection electrode CNE3, and the second light emitting element ED2 may be in contact with the second connection electrode CNE2 and the second connection electrode CNE4. The third light emitting element ED3 and the fourth light emitting element ED4 may have first ends in contact with the second type connection electrodes and second ends in contact with third type connection electrodes. The third light emitting element ED3 may be in contact with the third connection electrode CNE3 and the fifth connection electrode CNE5, and the fourth light emitting element ED4 may be in contact with the fourth connection electrode CNE4 and the fifth connection electrode CNE5.

The light emitting elements ED may be connected in series through the connection electrodes CNE. Since the display device 10 according to the embodiment may include a larger number of light emitting elements ED for each sub-pixel SPXn and the light emitting elements ED are connected in series, the light emission amount per unit area may be further increased.

Figure 23:
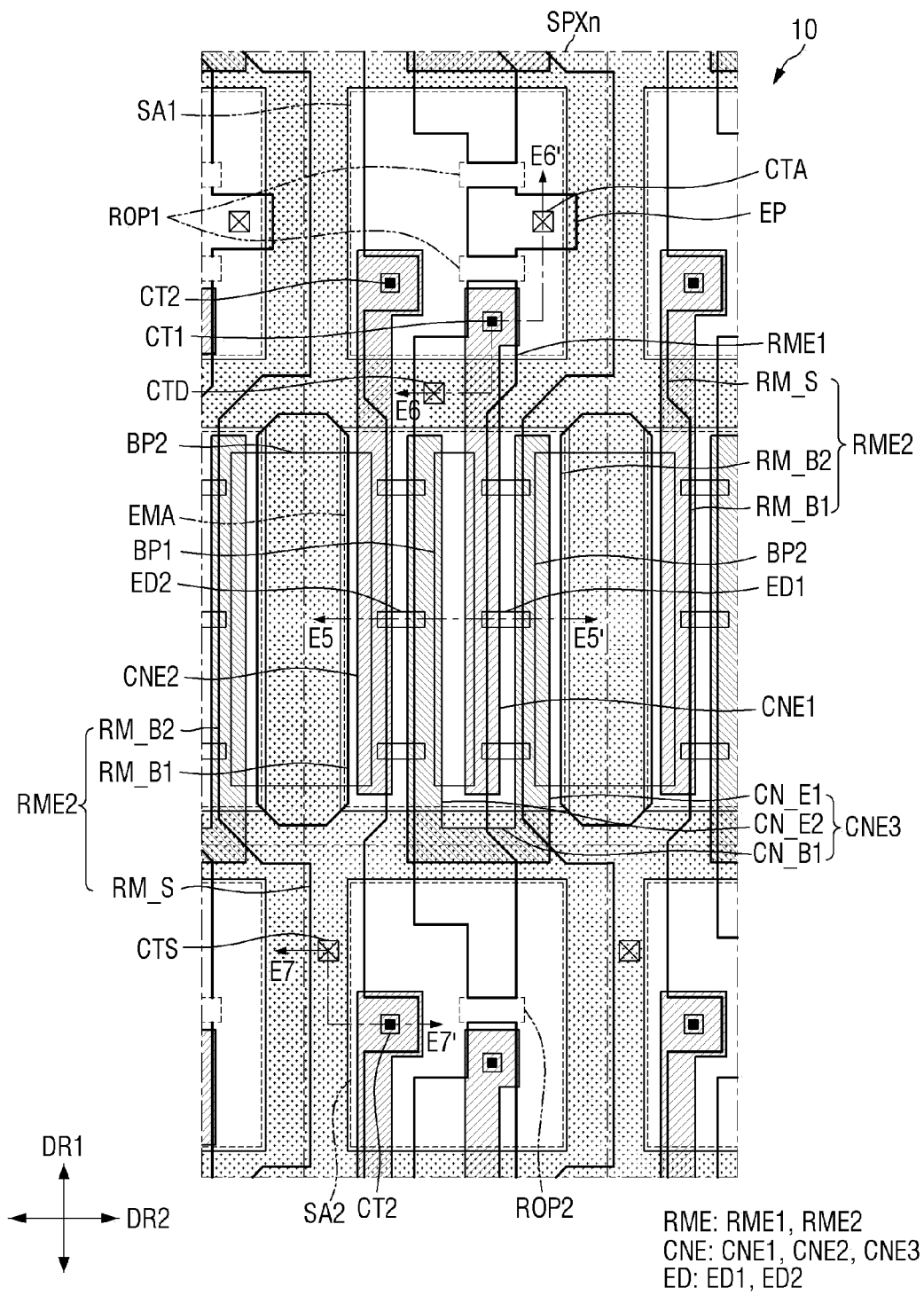
FIG. 23 is a schematic plan view illustrating a sub-pixel of a display device according to an embodiment.
Figure 24:
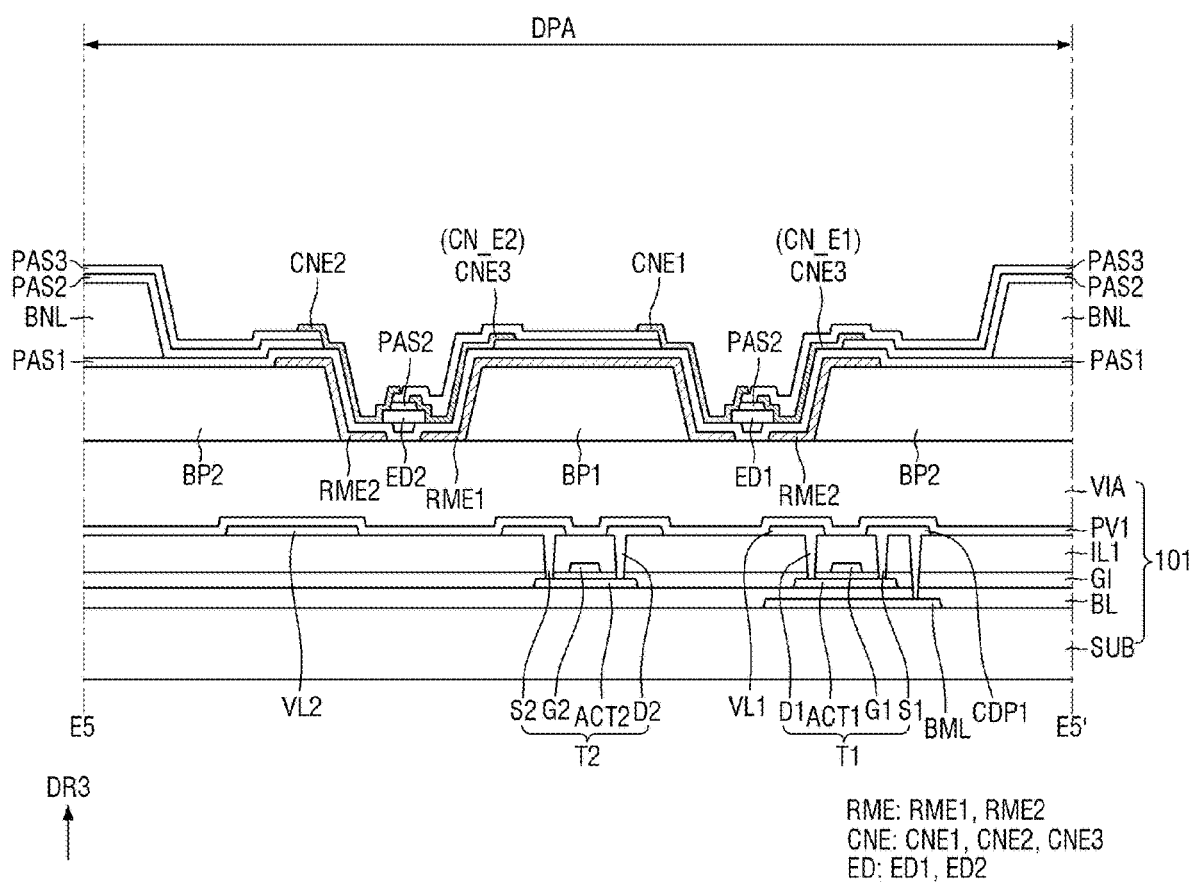
FIG. 24 is a schematic cross-sectional view taken along line E5-E5' in FIG. 23.
Figure 25:
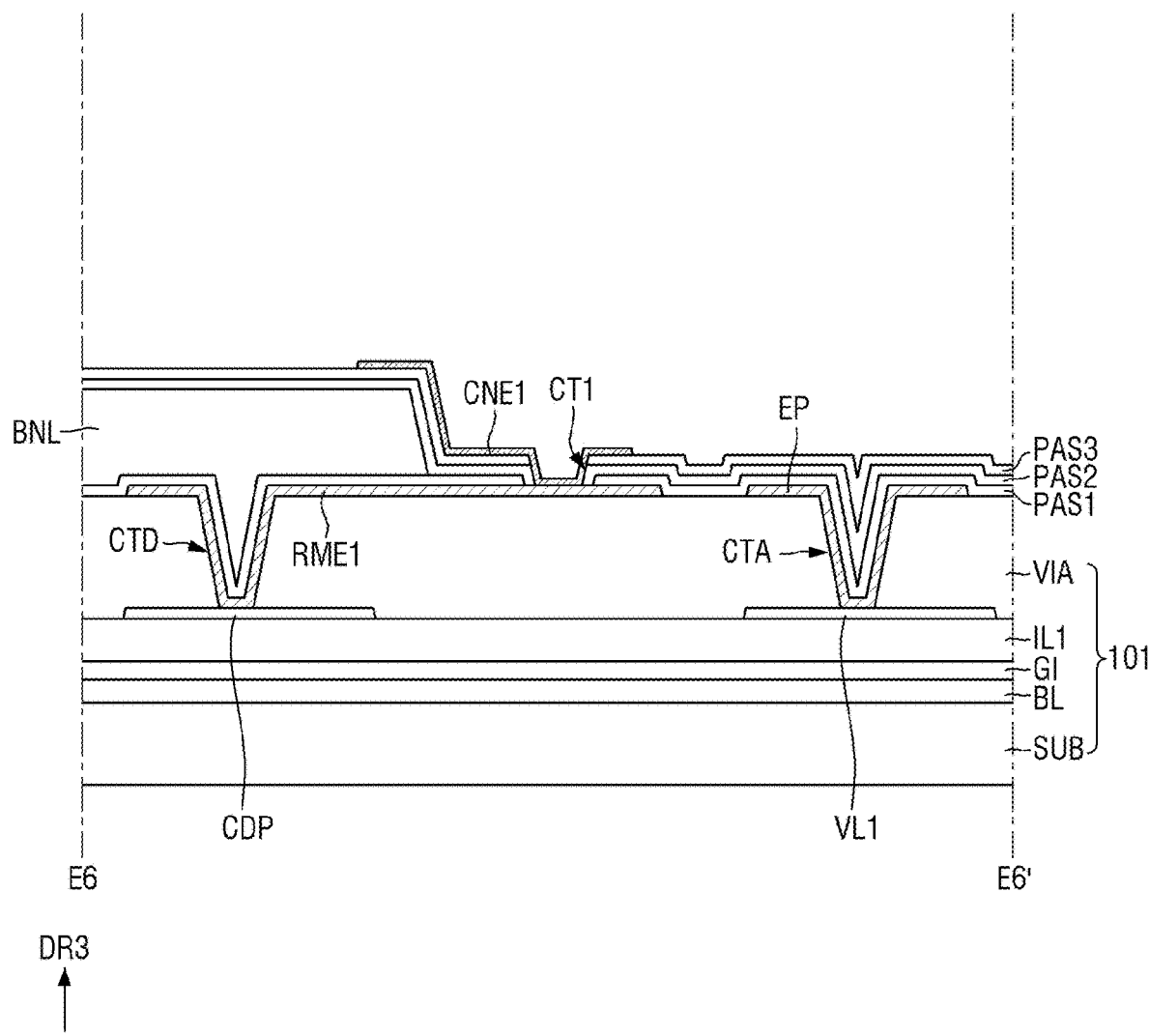
FIG. 25 is a schematic cross-sectional view taken along line E6-E6' in FIG. 23.
Figure 26:
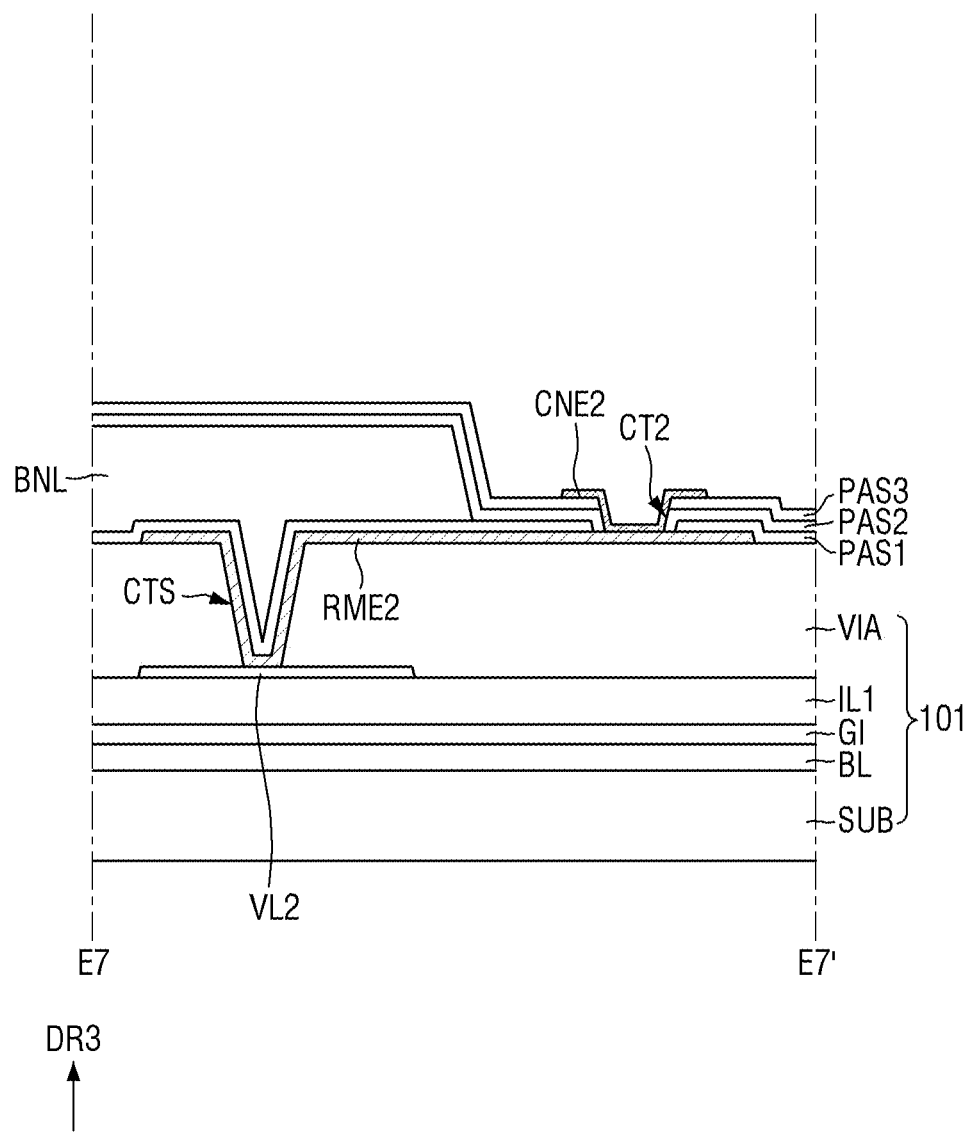
FIG. 26 is a schematic cross-sectional view taken along line E7-E7' in FIG. 23.

FIG. 23 is a schematic plan view illustrating a sub-pixel of a display device according to an embodiment. FIG. 24 is a schematic cross-sectional view taken along line E5-E5' in FIG. 23. FIG. 25 is a schematic cross-sectional view taken along line E6-E6' in FIG. 23. FIG. 26 is a schematic cross-sectional view taken along line E7-E7' in FIG. 23.

FIG. 23 illustrates planar arrangement of the electrodes RME (RME1 and RME2), the bank patterns BP1 and BP2, the bank layer BNL, the light emitting elements ED, and the connection electrodes CNE (CNE1, CNE2, and CNE3) disposed in one pixel PX of the display device 10. FIG. 24 illustrates a cross section across both ends of the light emitting elements ED (ED1 and ED2) disposed on different electrodes RME. FIGS. 25 and 26 illustrate cross sections across electrode contact holes CTD, CTS, and CTA, and the contact portions CT1 and CT2.

Referring to FIGS. 23 to 26, in the display device 10 according to one embodiment, the structures of the electrode RME, the connection electrode CNE, and the bank patterns BP1 and BP2 may be different from those in the above-described embodiments. Hereinafter, the redundant description of the above-described embodiments will be omitted while focusing on differences.

The bank patterns BP1 and BP2 may have a shape extending in the first direction DR1, and may have different widths measured in the second direction DR2. Any one of the bank patterns BP1 and BP2 may be disposed across the sub-pixels SPXn adjacent in the second direction DR2. For example, the bank patterns BP1 and BP2 may include the first bank pattern BP1 disposed in the emission area EMA of each sub-pixel SPXn and the second bank pattern BP2 disposed across the emission areas EMA of different sub-pixels SPXn.

The first bank pattern BP1 is disposed in the center of the emission areas EMA, and the second bank patterns BP2 are disposed to be spaced apart from the first bank pattern BP1 interposed therebetween. The first bank pattern BP1 and the second bank pattern BP2 may be alternately disposed along the second direction DR2. The light emitting elements ED may be disposed between the first bank pattern BP1 and the second bank pattern BP2 that are spaced apart from each other.

The first bank pattern BP1 and the second bank pattern BP2 may have the same length in the first direction DR1, but may have different widths measured in the second direction DR2. In the bank layer BNL, a portion extending in the first direction DR1 may overlap the second bank pattern BP2 in the thickness direction. The first bank pattern BP1 may be disposed to overlap the first electrode RME1, and the second bank pattern BP2 may be disposed to overlap electrode branch portions RM_B1 and RM_B2 of the second electrode RME2 and the bank layer BNL.

The first bank pattern BP1 and the second bank pattern BP2 may have the same length in the first direction DR1, but may have different widths measured in the second direction DR2. In the bank layer BNL, a portion extending in the first direction DR1 may overlap the second bank pattern BP2 in the thickness direction. The bank patterns BP1 and BP2 may be disposed in an island-like pattern on the entire surface of the display area DPA.

The electrodes RME include the first electrode RME1 disposed at the central portion of each sub-pixel SPXn and the second electrode RME2 disposed across different sub-pixels SPXn. The first electrode RME1 and the second electrode RME2 may substantially have a shape extending in the first direction DR1, and the portions of the first electrode RME1 and the second electrode RME2 disposed in the emission area EMA may have different shapes.

The first electrode RME1 may be disposed at the center of the sub-pixel SPXn, and the portion of the first electrode RME1 disposed in the emission area EMA may be disposed on the first bank pattern BP1. The first electrode RME1 may extend from the sub-region SA in the first direction DR1 to the sub-region SA of another sub-pixel SPXn. The first electrode RME1 may have a shape in which the width measured in the second direction DR2 changes depending on positions, and at least a portion of the first electrode RME1 overlapping the first bank pattern BP1 in the emission area EMA may have a width greater than that of the first bank pattern BP1.

The second electrode RME2 may include a portion extending in the first direction DR1 and portions branched near the emission area EMA. In one embodiment, the second electrode RME2 may include an electrode stem portion RM_S extending in the first direction DR1, the electrode branch portions RM_B1 and RM_B2 branched from the electrode stem portion RM_S to be bent in the second direction DR2 and extending in the first direction DR1 again. The electrode stem portion RM_S may be disposed to overlap the portion of the bank layer BNL extending in the first direction DR1, and may be disposed at one side or a side in the second direction DR2 of the sub-region SA. The electrode branch portions RM_B1 and RM_B2 may be branched from the electrode stem portion RM_S disposed at the portion of the bank layer BNL extending in the first direction DR1 and the portion of the bank layer BNL in the second direction DR2, and may be bent toward both sides in the second direction DR2. The electrode branch portions RM_B1 and RM_B2 may be disposed across the emission area EMA in the first direction DR1, and may be bent again to be integral with the electrode stem portion RM_S. For example, the electrode branch portions RM_B1 and RM_B2 of the second electrode RME2 may be branched on the upper side of the emission area EMA of any one sub-pixel SPXn, and may be connected to each other again on the lower side thereof.

The second electrode RME2 may include a first electrode branch portion RM_B1 disposed on the left side of the first electrode RME1 and a second electrode branch portion RM_B2 disposed on the right side of the first electrode RME1. The electrode branch portions RM_B1 and RM_B2 included in one second electrode RME2 may be disposed in the emission areas EMA of the sub-pixels SPXn adjacent in the second direction DR2, and the electrode branch portions RM_B1 and RM_B2 of different second electrodes RME2 may be disposed in one sub-pixel SPXn. The first electrode branch portion RM_B1 of the second electrode RME2 may be disposed on the left side of the first electrode RME1, and the second electrode branch portion RM_B2 of another second electrode RME2 may be disposed on the right side of the first electrode RME1.

The electrode branch portions RM_B1 and RM_B2 of the second electrode RME2 may overlap one side or a side of the second bank pattern BP2. The first electrode branch portion RM_B1 may partially overlap the second bank pattern BP2 disposed on the left side of the first bank pattern BP1, and the second electrode branch portion RM_B2 may partially overlap the second bank pattern BP2 disposed on the right side of the first bank pattern BP1. Both sides of the first electrode RME1 may face and be spaced apart from different electrode branch portions RM_B1 and RM_B2 of different second electrodes RME2, and the gap between the first electrode RME1 and each of the electrode branch portions RM_B1 and RM_B2 may be smaller than the gap between different bank patterns BP1 and BP2.

The width of the first electrode RME1 measured in the second direction DR2 may be greater than the widths of the electrode stem portion RM_S and the electrode branch portions RM_B1 and RM_B2 of the second electrode RME2. The first electrode RME1 may have a width greater than that of the first bank pattern BP1 and overlap both sides of the first bank pattern BP1, whereas the second electrode RME2 may have a relatively small width so that the electrode branch portions RM_B1 and RM_B2 may overlap only one side or a side of the second bank pattern BP2.

The first electrode RME1 may be in contact with the first conductive pattern CDP1 of the third conductive layer through the first electrode contact hole CTD at the portion overlapping the portion of the bank layer BNL extending in the second direction DR2. The second electrode RME2 may be in contact with the second voltage line VL2 of the third conductive layer through the second electrode contact hole CTS at the electrode stem portion RM_S. The portion of the first electrode RME1 disposed in the sub-region SA may be disposed to overlap the first contact portion CT1. The second electrode RME2 may have a portion that protrudes from the electrode stem portion RM_S in the second direction DR2 to be disposed in the sub-region SA, and the second electrode RME2 may overlap the second contact portion CT2 at the protruding part.

Between the first electrode RME1 and the second electrode RME2, the first electrode RME1 may extend to separation portions ROP1 and ROP2 of the sub-region SA, whereas the second electrode RME2 may not be separated in the sub-region SA. One second electrode RME2 may include electrode stem portions RM_S and the electrode branch portions RM_B1 and RM_B2, and may have a shape extending in the first direction DR1 and branched near the emission area EMA of each sub-pixel SPXn. The first electrode RME1 may be disposed between the separation portions ROP1 and ROP2 disposed in different sub-regions SA1 and SA2 of each sub-pixel SPXn and may be disposed across the emission area EMA.

In accordance with one embodiment, the display device 10 may include a wire connection electrode EP disposed between the first electrodes RME1 of different sub-pixels SPXn in the first sub-region SA1 among the sub-regions SA1 and SA2 of each sub-pixel SPXn. The wire connection electrode EP may not be disposed in the second sub-region SA of the sub-pixel SPXn, and the first electrodes RME1 of different sub-pixels SPXn adjacent in the first direction DR1 may be spaced apart from each other. In the sub-pixel SPXn illustrated in FIG. 24 among the sub-pixels SPXn, the first sub-region SA1 in which the wire connection electrode EP is disposed may be disposed on the upper side of the emission area EMA, and the second sub-region SA2 may be disposed on the lower side of the emission area EMA. On the other hand, in the sub-pixel SPXn adjacent to the sub-pixel SPXn of FIG. 24 in the first direction DR1, the first sub-region SA1 in which the wire connection electrode EP is disposed may be disposed on the lower side of the emission area EMA, and the second sub-region SA2 may be disposed on the upper side of the emission area EMA.

The first electrode RME1 may be spaced apart from the wire connection electrode EP with the first separation part ROP1 interposed therebetween in the first sub-region SA1. Two first separation portions ROP1 may be disposed in one first sub-region SA1. The wire connection electrode EP may be spaced apart from the first electrode RME1 disposed in the corresponding sub-pixel SPXn with a lower first separation portion ROP1 interposed therebetween, and may be spaced apart from the first electrode RME1 disposed in another sub-pixel SPXn with an upper first separation portion ROP1 interposed therebetween. One second separation portion ROP2 may be disposed in the second sub-region SA2, and different first electrodes RME1 may be spaced apart from each other in the first direction DR1.

In one embodiment, the wire connection electrode EP may be connected to the first voltage line VL1 of the third conductive layer through the third electrode contact hole CTA penetrating the via layer VIA. The first electrode RME1 may be connected to the wire connection electrode EP, and the electric signal applied to arrange the light emitting elements ED may be applied from the first voltage line VL1 to the first electrode RME1 through the wire connection electrode EP. In the process of arranging the light emitting elements ED, signals may be applied to the first voltage line VL1 and the second voltage line VL2, and may be transmitted to the first electrode RME1 and the second electrode RME2.

A relative arrangement of the second electrode contact hole CTS may be different from that of the third electrode contact hole CTA to be described later. The second electrode contact hole CTS may be disposed at the portion of the bank layer BNL surrounding the second sub-region SA2, and the third electrode contact hole CTA may be disposed in the first sub-region SA1. Since the second electrode contact hole CTS and the third electrode contact hole CTA expose the top surfaces of different voltage lines VL1 and VL2, respectively, the positions of the electrode contact holes may be determined to correspond thereto.

The bank layer BNL may surround the emission area EMA and the sub-regions SA1 and SA2 similarly to the above-described embodiment. However, in the embodiment in which the display device 10 may include the sub-regions SA1 and SA2 distinguished from each other, the areas surrounded by the bank layer BNL may be distinguished from each other. The bank layer BNL is the same as that in the above-described embodiment except that it surrounds different sub-regions SA1 and SA2.

The light emitting elements ED may be disposed on different electrodes RME between different bank patterns BP1 and BP2. The light emitting element ED may include the first light emitting element ED1 having both ends disposed on the first electrode RME1 and the second electrode branch portion RM_B2 of the second electrode RME2, and the second light emitting element ED2 having both ends disposed on the first electrode RME1 and the first electrode branch portion RM_B1 of another second electrode RME2. The first light emitting elements ED1 may be disposed on the right side with respect to the first electrode RME1, and the second light emitting elements ED2 may be disposed on the left side with respect to the first electrode RME1. The first light emitting elements ED1 may be disposed on the first electrode RME1 and the second electrode RME2, and the second light emitting elements ED2 may be disposed on the first electrode RME1 and the second electrode RME2.

The connection electrodes CNE (CNE1, CNE2, and CNE3) may include a first connection electrode CNE1, a second connection electrode CNE2, and a third connection electrode CNE3.

The first connection electrode CNE1 may have a shape extending in the first direction DR1 and may be disposed on the first electrode RME1. A portion of the first connection electrode CNE1 disposed on the first bank pattern BP1 may overlap the first electrode RME1, and may extend therefrom in the first direction DR1 to be disposed in the first sub-region SA1 located on the upper side of the emission area EMA over the bank layer BNL. The first connection electrode CNE1 may be in contact with the first electrode RME1 through the first contact portion CT1 in the first sub-region SA1.

The second connection electrode CNE2 may have a shape extending in the first direction DR1 and may be disposed on the second electrode RME2. A portion of the second connection electrode CNE2 disposed on the second bank pattern BP2 may overlap the second electrode RME2, and may extend therefrom in the first direction DR1 to be disposed in the first sub-region SA1 located on the upper side of the emission area EMA over the bank layer BNL. The second connection electrode CNE2 may be in contact with the second electrode RME2 through the second contact portion CT2 in the first sub-region SA1.

In the sub-pixel SPXn adjacent to the sub-pixel SPXn of FIG. 24 in the first direction DR1, the first connection electrode CNE1 and the second connection electrode CNE2 may be in contact with the first electrode RME1 and the second electrode RME2 through the contact portions CT1 and CT2 disposed in the second sub-region SA2, respectively.

The third connection electrode CNE3 may include the extension portions CN_E1 and CN_E2 extending in the first direction DR1 and a first connection portion CN_B1 connecting the extension portions CN_E1 and CN_E2. The first extension portion CN_E1 may be disposed on the second electrode branch portion RM_B2 of the second electrode RME2 while facing the first connection electrode CNE1 in the emission area EMA, and the second extension portion CN_E2 may be disposed on the first electrode RME1 while facing the second connection electrode CNE2 in the emission area EMA. The first connection portion CN_B1 may extend in the second direction DR2 on the bank layer BNL disposed on the lower side of the emission area EMA to connect the first extension portion CN_E1 to the second extension portion CN_E2. The third connection electrode CNE3 may be disposed on the emission area EMA and the bank layer BNL, and may not be connected to or directly connected to the electrode RME. The second electrode branch portion RM_B2 disposed under or below the first extension portion CN_E1 may be electrically connected to the second voltage line VL2, and the second power voltage applied to the second electrode branch portion RM_B2 may not be transmitted to the third connection electrode CNE3.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
   a substrate including a display area and a pad area disposed on a side of the display area;
   conductive layers including wires and conductive patterns disposed in the display area and the pad area, each of the conductive layers includes a first metal layer and a second metal layer disposed on the first metal layer with the second metal layer containing copper (Cu) and having a grain size of about 155 nm or less and including copper grains of a random grain orientation;
   a via layer disposed on the conductive layers;
   a first electrode and a second electrode disposed on the via layer in the display area, the first electrode and the second electrode being spaced apart from each other;
   a first insulating layer disposed on the first electrode and the second electrode;
   light emitting elements disposed on the first electrode and the second electrode, the light emitting elements being spaced apart from each other on the first insulating layer;
   a first connection electrode disposed on the first electrode and electrically contacting the light emitting elements; and
   a second connection electrode disposed on the second electrode and electrically contacting the light emitting elements.

2. The display device of claim 1, wherein the second metal layer has a resistivity of about 2.3 μΩcm or less.

3. The display device of claim 1, wherein
   the first metal layer has a thickness of about 500 Å or less, and
   the second metal layer has a thickness in a range of about 3000 Å to about 17000 Å.

4. The display device of claim 1, wherein
   the first metal layer includes titanium (Ti), and
   the second metal layer includes a copper alloy containing copper (Cu) as a main component and including at least one of silver (Ag), magnesium (Mg), aluminum (Al), indium (In), niobium (Nb), and boron (B) as an impurity metal.

5. The display device of claim 4, wherein the second metal layer includes the impurity metal at a content of about 5 at % or less.

6. The display device of claim 1, wherein the first metal layer includes: a titanium alloy containing titanium (Ti) as a main component and containing zinc (Zn) as an impurity metal, or a copper alloy containing copper (Cu) as a main component and containing at least one of silver (Ag), magnesium (Mg), aluminum (Al), indium (In), niobium (Nb), and boron (B) as an impurity metal.

7. The display device of claim 1, wherein the first metal layer is made of at least one of zinc oxide (ZnO) and indium-zinc oxide (IZO).

8. A display device comprising:
   a substrate including a display area and a pad area disposed on a side of the display area:
   conductive layers including wires and conductive patterns disposed in the display area and the pad area, each of the conductive layers includes a first metal layer and a second metal layer disposed on the first metal layer with the second metal layer containing copper (Cu) and having a grain size of about 155 nm or less;
   a via layer disposed on the conductive layers:
   a first electrode and a second electrode disposed on the via layer in the display area, the first electrode and the second electrode being spaced apart from each other;
   a first insulating layer disposed on the first electrode and the second electrode;

light emitting elements disposed on the first electrode and the second electrode, the light emitting elements being spaced apart from each other on the first insulating layer;
a first connection electrode disposed on the first electrode and electrically contacting the light emitting elements; and
a second connection electrode disposed on the second electrode and electrically contacting the light emitting elements, wherein the conductive layer includes:
a first conductive layer including:
a lower metal layer disposed in the display area; and
a first pad wire disposed in the pad area;
a second conductive layer including:
gate electrodes disposed in the display area on the first conductive layer; and
a second pad wire disposed in the pad area; and
a third conductive layer including:
a first conductive pattern disposed in the display area on the second conductive layer; and
a pad electrode lower layer disposed in the pad area, and
the via layer includes:
a pad electrode upper layer disposed on the third conductive layer in the display area and disposed on the pad electrode lower layer in the pad area; and
a pad electrode capping layer disposed on the pad electrode upper layer.

9. The display device of claim 8, further comprising:
a first gate insulating layer disposed between the first conductive layer and the second conductive layer;
a first interlayer insulating layer disposed between the second conductive layer and the third conductive layer; and
a first passivation layer disposed on the third conductive layer,
wherein each of the first gate insulating layer, the first interlayer insulating layer, and the first passivation layer includes an inorganic insulating material.

10. The display device of claim 9, wherein
the pad electrode upper layer, the first electrode, and the second electrode include a same material, and
the pad electrode capping layer, the first connection electrode, and the second connection electrode include a same material.

11. The display device of claim 9, wherein
the conductive layer further includes a fourth conductive layer disposed on the third conductive layer, and including a first voltage line and a second voltage line,
the display device further includes:

a second interlayer insulating layer disposed on the first passivation layer; and
a second passivation layer disposed on the fourth conductive layer.

12. The display device of claim 11, wherein
the via layer includes trenches exposing a part of a top surface of the second passivation layer,
at least a part of the first electrode and the second electrode is disposed directly on the second passivation layer in the trenches, and
the light emitting elements are disposed in the trenches.

13. A wiring substrate comprising:
conductive layers including wires and conductive patterns disposed on a substrate; and
at least one insulating layer disposed between the conductive layers, wherein
the conductive layers include a first metal layer and a second metal layer disposed on the first metal layer,
the second metal layer contains copper (Cu),
the second metal layer has a grain size of about 155 nm or less and includes copper grains of a random grain orientation, and
the second metal layer has a resistivity of about 2.3 µΩcm or less.

14. The wiring substrate of claim 13, wherein
the first metal layer has a thickness of about 500 Å or less, and
the second metal layer has a thickness in a range of about 3000 Å to about 17000 Å.

15. The wiring substrate of claim 13, wherein
the first metal layer includes titanium (Ti), and
the second metal layer includes a copper alloy containing copper (Cu) as a main component and including at least one of silver (Ag), magnesium (Mg), aluminum (Al), indium (In), niobium (Nb), and boron (B) as an impurity metal.

16. The wiring substrate of claim 15, wherein the second metal layer includes the impurity metal at a content of about 5 at % or less.

17. The wiring substrate of claim 13, wherein the first metal layer includes: a titanium alloy containing titanium (Ti) as a main component and containing zinc (Zn) as an impurity metal, or a copper alloy containing copper (Cu) as a main component and containing at least one of silver (Ag), magnesium (Mg), aluminum (Al), indium (In), niobium (Nb), and boron (B) as an impurity metal.

18. The wiring substrate of claim 13, wherein the first metal layer is made of at least one of zinc oxide (ZnO) and indium-zinc oxide (IZO).

* * * * *